United States Patent [19]

Fan et al.

[11] Patent Number: 5,610,413
[45] Date of Patent: Mar. 11, 1997

[54] GROUP II-VI COMPOUND SEMICONDUCTOR LIGHT EMITTING DEVICES AND AN OHMIC CONTACT THEREFOR

[75] Inventors: Yongping Fan; Jung Han, both of West Lafayette, Ind.; Arto V. Nurmikko, Providence, R.I.; Robert L. Gunshor; Li He, both of West Lafayette, Ind.

[73] Assignee: Research Corporation Technologies, Inc., Tucson, Ariz.

[21] Appl. No.: 484,088

[22] Filed: Jun. 7, 1995

Related U.S. Application Data

[60] Division of Ser. No. 207,327, Mar. 7, 1994, Pat. No. 5,548,137, which is a continuation-in-part of Ser. No. 995,454, Dec. 22, 1992, abandoned.

[51] Int. Cl.$^6$ ..................................................... H01L 33/00
[52] U.S. Cl. ............................. 257/97; 257/23; 257/101; 257/102; 257/103; 372/45
[58] Field of Search ................................. 257/23, 94, 96, 257/97, 99, 101, 102, 103; 372/45, 46, 47, 48, 50

[56] References Cited

U.S. PATENT DOCUMENTS

| | | |
|---|---|---|
| 3,148,085 | 9/1964 | Wiegmann . |
| 3,942,065 | 3/1976 | Russ . |
| 4,012,243 | 3/1977 | Keil et al. . |
| 4,148,045 | 4/1979 | Fang et al. . |
| 4,211,586 | 7/1980 | Fang et al. . |
| 4,254,429 | 3/1981 | Yamazaki . |
| 4,411,728 | 10/1983 | Sakamoto . |
| 4,647,813 | 3/1987 | Kitabayashi et al. . |
| 4,672,266 | 6/1987 | Taniguchi et al. . |
| 4,810,937 | 3/1989 | Havel . |
| 4,868,615 | 9/1989 | Kamata . |
| 4,916,496 | 4/1990 | Tomomura et al. . |

(List continued on next page.)

FOREIGN PATENT DOCUMENTS

| | | |
|---|---|---|
| 0552023 | 1/1993 | European Pat. Off. . |
| 0574947 | 6/1993 | European Pat. Off. . |
| WO93/23883 | 11/1993 | WIPO . |

OTHER PUBLICATIONS

Chang et al., "Source Shaping in the Fabrication of Semiconductor Light-Emitting Diodes by Molecular Beam Epitaxy," IBM Technical Disclosure Bulletin, vol. 15, No. 1, Jun. 1972, pp. 180–181.

(List continued on next page.)

*Primary Examiner*—Ngân V. Ngô
*Attorney, Agent, or Firm*—Scully, Scott, Murphy & Presser

[57] ABSTRACT

Group II–VI compound semiconductor light emitting devices which include at least one II–VI quantum well region of a well layer disposed between first and second barrier layers is disclosed. The quantum well region is sandwiched between first and second cladding layers of a II–VI semiconductor material. The first cladding layer is formed on and lattice matched to the first barrier layer and to a substrate of a III–V compound semiconductor material. The second cladding layer is lattice matched to the second barrier layer. The quantum well layer comprises a II–VI compound semiconductor material having the formula $A_xB_{(1-x)}C$ wherein A and B are two different elements from Group II and C is at least one element from Group VI. When the second cladding layer has a p-type conductivity, a graded bandgap ohmic contact according to the present invention can be utilized. The graded bandgap contact can be a single continuously graded II–VI p-type region or a plurality of cells with each of the cells having first and second thin layers of first and second p-type II–VI semiconductor materials respectively. Another embodiment of the present invention discloses a monolithic multicolor light emitting element capable of emitting four colors and a method for fabricating same. The monolithic multicolor element includes four II–VI semiconductor light emitting devices formed on a single III–V substrate.

65 Claims, 9 Drawing Sheets

U.S. PATENT DOCUMENTS

| | | |
|---|---|---|
| 4,955,031 | 9/1990 | Jain . |
| 4,992,837 | 2/1991 | Sakai et al. . |
| 5,008,891 | 4/1991 | Morita . |
| 5,010,376 | 4/1991 | Nishimura et al. . |
| 5,037,709 | 8/1991 | Tomomura et al. . |
| 5,043,774 | 8/1991 | Shiki . |
| 5,045,894 | 9/1991 | Migita et al. . |
| 5,045,897 | 9/1991 | Ahlgren . |
| 5,055,363 | 10/1991 | Tomomura et al. . |
| 5,061,973 | 10/1991 | Chu . |
| 5,081,632 | 1/1992 | Migita et al. . |
| 5,091,758 | 2/1992 | Morita . |
| 5,097,298 | 3/1992 | Ehara . |
| 5,103,269 | 4/1992 | Tomomura et al. . |
| 5,113,233 | 5/1992 | Kitagawa et al. . |
| 5,119,386 | 6/1992 | Narusawa . |
| 5,213,998 | 5/1993 | Qiu et al. . |
| 5,274,269 | 12/1993 | DePuydt et al. . |
| 5,291,507 | 3/1994 | Haas et al. . |
| 5,294,833 | 3/1994 | Schetzina ................................ 257/741 |
| 5,366,927 | 11/1994 | Schetzina . |
| 5,377,214 | 12/1994 | Ahn ........................................ 372/45 |
| 5,389,800 | 2/1995 | Itaya et al. ............................. 257/94 |
| 5,396,103 | 3/1995 | Oiu et al. ............................... 257/744 |
| 5,404,027 | 4/1995 | Haase et al. ........................... 257/13 |
| 5,406,574 | 4/1995 | Kennie et al. ......................... 372/45 |
| 5,422,902 | 6/1995 | Mensz . |

OTHER PUBLICATIONS

Kobuyashi et al., "The MBE Growth of Widegap II–VI Injection Lasers and LED's," Optoelectron, Devices, Technol., vol. 7, No. 1, Jun. 1992 (abs), pp. 1–10.

Akimoto et al., "Electroluminescence in an Oxygen–Doped ZnSe p–n Junction Grown by Molecular Beam Epitaxy," Japanese J. of Appl. Phys., vol. 28, No. 4, pp. L531–L534 (1989).

Butkhuzi et al., "Blue Light Emitting Diodes on the Base of ZnSe Single Crystals," J. of Crystal Growth 117, pp. 1055–1058 (1992).

DePuydt et al., "ZnSe–Based Laser Diodes," J. of Crystal Growth 117, p. 1078 (1992).

Fan et al., "Blue Electroluminescence in Forward–Biased ZnSe Diodes," IEEE Transactions of Electron Devices, vol. ED–28, No. 4, p. 428–433 (1981).

Fu et al., "Isoelectronic δ Doping in a ZnSe Superlattice: Tellurium as an Efficient Hole Trap," Physical Review B, vol. 39, No. 5, pp. 3173–3177 (1989).

Guan et al., "Photopumped Antiguide Blue Lasers Fabricated from Molecular Beam Epitaxial ZnSe on GaAs," IEE Photonics Technology Letters, vol. 3, No. 8, pp. 685–687 (1991).

Haase et al., "Characterization of p–Type ZnSe," J. Appl. Phys., vol. 67, No. 1, pp. 448–452 (1990).

Haase et al., "Blue–Green Laser Diodes," Appl. Phys. Lett. vol. 59, No. 11, pp. 1272–1274 (1991).

Hobbs, "Diodes Produce Ultrafast Pulses and Show Blue–Green Emission," Laser Focus World, pp. 99–102 (May 1992).

Jeon et al., "Room–Temperature Blue Lasing Action in (Zn,Cd)Se/ZnSe Optically Pumped Multiple Quantum Well Structures on Lattice–Matched (Ca,In)As Substrates," Appl. Phys. Lett., vol. 57, No. 3, pp. 2413–2415 (1990).

Kolodziejski et al., "Excitonic Trapping from Atomic Layer Epitaxial ZnTe Within ZnSe/(Zn,Mn)Se Heterostructures," Appl. Phys. Lett., vol. 52, No. 13, pp. 1080–1082 (1988).

Lee et al., "Widely Tunable Exciton Radiative Recombination Rate in ZnSe Based Superlattic Structures," Superlattices and Microstructures, vol. 5, No. 3, pp. 345–349 (1989).

Migita et al., "ZnSe p–n Junctions Prouded by Metalorganic Molecular–Beam Epitaxy," J. Appl. Phys., vol. 68, No. 2, pp. 880–882 (1990).

Niina et al., "Ga–Doped ZnSe Grown by Molecular Beam Epitaxy for Blue Light Emitting Diodes," Japanese J. of Appl. Phys., vol. 21, No. 6, pp. L387–L389 (1982).

Nishizawa et al., "Blue Light Emission from ZnSe p–n Junctions," J. Appl. Phys., vol. 57, No. 6, pp. 2210–2216 (1985).

Ohkawa et al., "Blue Electroluminescence from ZnSe p–n Junction Light–Emitting Diodes," Japanese J. of Appl. Phys., vol. 30, No. 12B, pp.3873–3875 (1991).

Park et al., "P–type ZnSe by Nitrogen Atom Beam Doping During Molecular Beam Epitaxial Growth," Appl. Phys. Lett., vol. 57, No. 20, pp. 2127–2129 (1990).

Qiu et al., "Heavily Doped p–ZnSe:N Grown by Molecular Beam Epitaxy," Appl. Phys. Lett., vol. 59, No. 23, pp. 2992–2994 (1991).

Ren et al., "Blue (ZnSe) and Green ($ZnSe_{0.9}Te_{0.1}$) Light Emitting Diodes," J. of Crystal Growth 111, pp. 829–832 (1991).

Ren et al., "ZnSe Light–Emitting Diodes," Appl. Phys. Lett., vol. 57, No. 18, pp. 1901–1903 (1990).

Walecki et al., "Band Offsets and Exciton Confinement in $Zn_{1-y}Cd_y Se/Zn_{1-x}Mn_xSe$ Quantum Wells," vol. 57, No. 5, pp. 466–468 (1990).

Walecki et al., "Ultraviolet and Blue Holographic Lithography of ZnSe Epilayers and Heterostructures with Feature Size to 100 nm and Below," Appl. Phys. Lett., vol. 57, No. 25, pp. 2641–2643 (1990).

Yang et al., "Room Temperature Blue Lasing of $ZnSxSe_{1-x}$ Alloys by Photopumping," Appl. Phys. Lett., vol. 60, No. 8, pp. 926–928 (1992).

Yasuda et al., "Metalorganic Vapor Phase Epitaxy of Low–Resistivity p–Type ZnSe," Appl. Phys. Lett. vol. 52, No. 1, pp. 57–59 (1988).

"Strained–Lattice Growth Increases Efficiency of Blue–Green Diode Lasers," Laser Focus World, p. 9 (Feb. 1992).

Haase et al., "Short Wavelength II–VI Laser Diodes," Proceedings of the 18th International Symposium on Gallium Arsenide and Related Compounds, Sep. 9–12, 1991, IBM Technical Disclosure Bulletin, vol. 15, pp. 10–16.

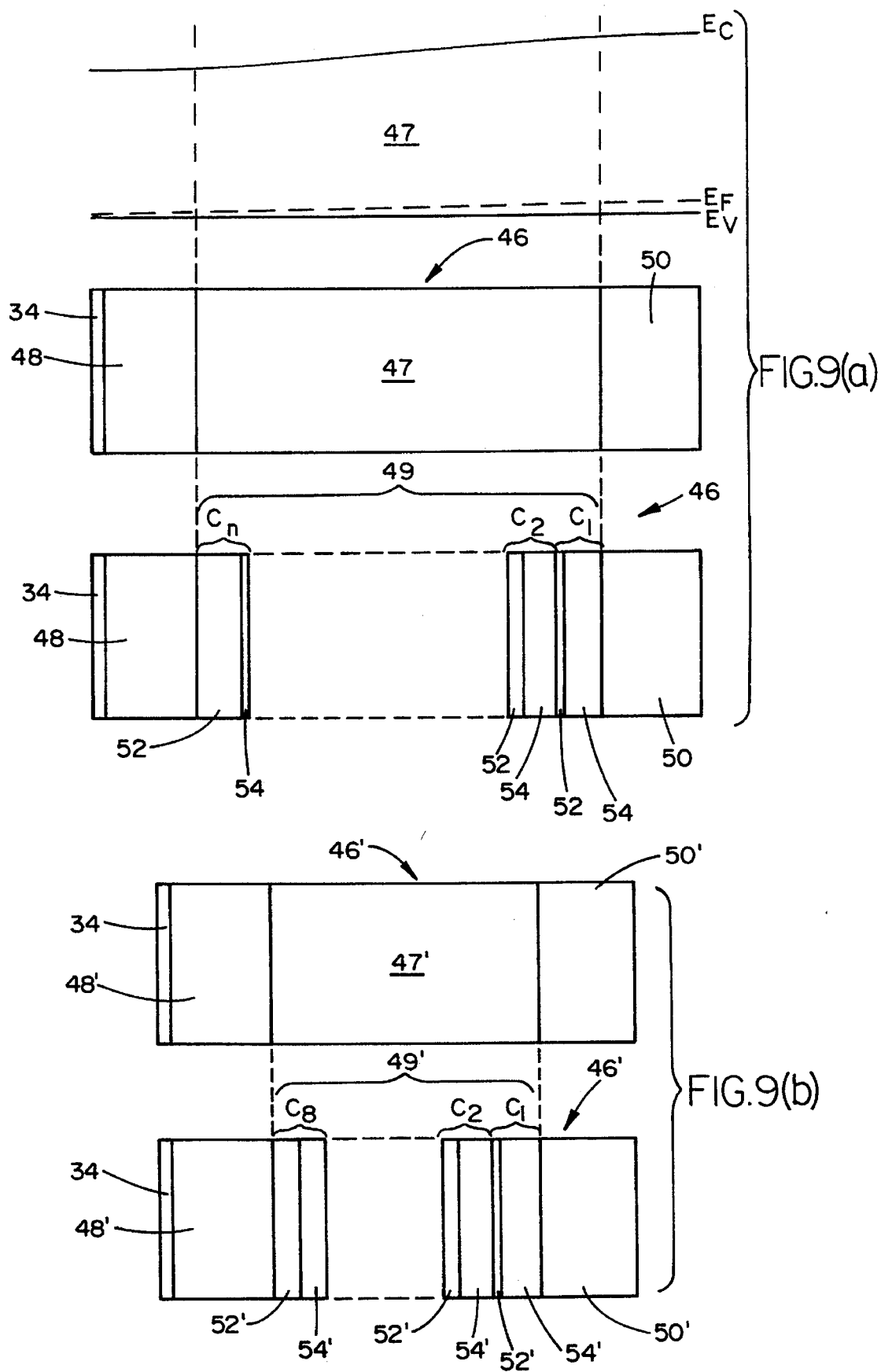

GROUP II-VI COMPOUND SEMICONDUCTOR LIGHT EMITTING DEVICES AND AN OHMIC CONTACT THEREFOR

This is a divisional of application Ser. No. 08/207,327, filed on Mar. 7, 1994, now U.S. Pat. No. 5,548,137, which is a C-I-P of U.S. Ser. No. 07/995,454, filed on Dec. 22, 1992, now abandoned.

The present research project was supported by grants from the Defense Advanced Research Projects Agency/ University Research Initiative, Grant Nos. 286-25043 and 218-25015; Defense Advanced Research Projects Agency/ Office of Naval Research, Grant Nos. N00014-903-J-1582 and N00014-92-J-1893; Air Force Office of Scientific Research, Grant Nos. AFOSR-89-0438 and F49620-92-J-0440; National Science Foundation/Materials Research Group, Grant Nos. ECS8916026 and 8913706-DMR and Indiana Business Modernization and Technology, Grant No. P-5058.

BACKGROUND OF THE INVENTION

1. Field of the Invention

The present invention relates generally to compound semiconductor light emitting devices and, more particularly, to Group II-VI compound semiconductor light emitting devices which include at least one II-VI compound semiconductor quantum well layer disposed between II-VI compound semiconductor barrier layers.

2. Description of the Prior Art

Semiconductor lasers and light emitting diodes (LEDs) have a variety of applications including long distance fiber-optic communications, laser printers and compact disk players. Heretofore, these laser and LED devices were based on gallium arsenide (GaAs) and related Group III-V compound semiconductor materials, which operate at, and are limited to, infrared, and sometimes red, wavelengths. However, there are many advantages and potential applications for compact lasers and light emitting diodes at blue and blue/green wavelengths. Short wavelength semiconductor lasers would be extremely useful in optical data storage systems and display devices to increase information density which is inversely proportional to the square of the optical wavelength. For example, if a blue light semiconductor laser is utilized for an optical disk, the recording density can be increased. Also, the lack of a blue or blue-green laser or LED has made it impossible to complete the spectrum for high definition television (HDTV) systems. A further application of short wavelength lasers, such as a blue or blue-green laser, is a signal carrier for communications through sea water and ice since blue and blue-green light travel farther than other hues underwater. Other applications, both commercial and military, are also feasible. The basic advantage of blue and blue-green LEDs and lasers as compared to red and infrared, is the shorter wavelength, resulting in higher resolution as well as the increased sensitivity of the human eye to green and blue light.

Since semiconductor lasers and LEDs having shorter visible wavelengths than red and infrared have many advantages and practical applications, physicists, material scientists and electrical engineers have pursued the idea of extending these devices to shorter visible wavelengths since the 1960's. Approaches such as frequency doubling, GaN and SiC have met with only limited success. To date, the most promising medium for achieving emission at short wavelengths are direct bandgap II-VI semiconductor compounds with bandgap energies exceeding about 2.5 eV. The original concept was to make use of the direct bandgap recombination of such wide bandgap II-VI compound semiconductors as zinc selenide (ZnSe), zinc sulfide (ZnS) and zinc telluride (ZnTe).

There were two principal problems with such II-VI semiconductor materials: (a) achieving electrical control of the semiconductors by doping, and (b) the substantial defect state density within the bandgap due to impurities and defects, with doping often directly contributing to the latter. For example, it was possible to make some compounds p-type (such as ZnTe) and others n-type (ZnSe, ZnS) but it was impossible to obtain low resistivity in both polarities of a given compound, so the formation of a p-n junction was a difficult, almost impossible task.

Early efforts to develop II-VI technology primarily involved growing bulk crystals or films with equilibrium methods. These equilibrium grown crystals generally had large numbers of defects and significant concentrations of background impurities. About ten years ago non-equilibrium crystal growth techniques were investigated and the recent breakthroughs in wide-bandgap II-VI light emitters stem from molecular beam epitaxy (MBE), a non-equilibrium technique.

Early attempts to incorporate nitrogen by MBE were unsuccessful in obtaining p-type conductivity; neither were attempts to dope with P and As. The use of Li as a p dopant in MBE was somewhat more successful. Fundamental difficulties in the use of Li, however, included the tendency to incorporate Li interstitially (acting as an n-dopant) as well as the high diffusion coefficient of Li. Recently, Park et al., "P-Type ZnSe by Nitrogen Atom Beam Doping During Molecular Beam Epitaxial Growth", *Appl. Phys. Lett.*, 57(20), pp. 2127–29 (1990) and Ohkawa et al., *Japan J. of Appl. Phys.*, Vol. 30, p. L152 (1991) have obtained significant levels of p doping in ZnSe using a nitrogen rf plasma source. The use of the nitrogen plasma source has led to doping levels ranging from mid $10^{17}$ cm$^{-3}$ to $10^{18}$ cm$^{-3}$ (comparable to the levels achieved in GaAs) resulting in the realization of pn junction light emitting devices operating in the blue and blue/green portion of the spectrum such as light emitting diodes and pulsed lasers. For example, Park et al., "P-Type ZnSe by Nitrogen Atom Beam Doping During Molecular Beam Epitaxial Growth", *Appl. Phys. Lett.*, 57(20), pp. 2127–29 (1990) discloses blue LEDs based on p-type ZnSe epitaxial layers involving nitrogen atom beam doping during MBE growth. The LED includes a pn Junction of ZnSe formed on a GaAs substrate. An n-type cap layer is formed on the pn junction and an ohmic contact is formed thereon.

Concerning the second problem stated above, as a result of the presence of defects and imperfections, even when electrons and holes were introduced by external excitation (such as light or electron beams), the radiative yield of blue-green photons was very poor except at very low temperatures. In addition to these difficulties, not all of the compounds of interest possessed the same crystal structure (phase). A structure mismatch can be fatal when trying to construct layered heterostructure configurations such as those used in GaAs/(Al,Ga)As infrared lasers. (The notation (A,B) where A and B are elements of the periodic table corresponds to a chemical composition $A_xB_{(1-x)}$ and will be used throughout the present specification. Accordingly, the notation (Al,Ga)As corresponds to a chemical composition $Al_xGa_{1-x}As$).

Recent breakthroughs in the development of widegap II-VI light emitters allow fabrication of more complicated structures that include superlattice geometries with quantum well(s) to enhance the radiative recombination probability and the light emission of the devices. For example, Jeon et al., "Room Temperature Blue Lasing Action in (Zn,Cd)Se/ZnSe Optically Pumped Multiple Quantum Well Structures on Lattice Matched (Ga,In)As Substrates", *Appl. Phys. Lett.*, 57(23), pp. 2413–2415 (1990) discloses optically pumped laser action in (Zn,Cd)Se/ZnSe multiple quantum well structures prepared by MBE on bulk (Ga,In)As substrates. Haase, et al., "Blue-Green Laser Diodes", *Appl. Phys. Lett.*, 59(11), pp. 1272–74 (1991) discloses a blue-green laser diode which includes a (Cd,Zn)Se quantum well disposed between a pn junction of ZnSe. The device includes Zn(S,Se) cladding layers and is formed on an n-GaAs substrate. However, there are a substantial number of misfit dislocations (defects) as a result of the lattice mismatch between the Zn(S,Se) cladding layers and the ZnSe barrier layers. U.S. Pat. Nos. 5,081,632 and 5,045,894 disclose blue LED devices which include a $ZnS_{0.65}Te_{0.35}$ QW formed between a homojunction of $ZnS_{0.08}Se_{0.98}$. The devices are formed on GaAs substrates. U.S. Pat. No. 5,045,897 discloses a double heterojunction laser which includes a multiple quantum well (MQW) sandwiched between cladding layers of Zn(S,Se) formed on a GaAs substrate. The MQW includes alternating layers of II–VI quaternary $Hg_{1-x}Zn_xS_{1-y}Se_y$ and ZnSe or Zn(S,Se).

Each of the above devices still suffer from problems such as strain related defects, inadequate operation at room temperature and device failure due to excess heating at the contact. With regard to the contact problem, conventional contacting to the p region (p-ZnSe top layer) was implemented by simply evaporating gold and then soldering a bonding wire to the gold using indium metal. The gold does not form an ohmic contact but instead forms a Schottky barrier with the p-region thereby causing a serious heating problem which can lead to device failure. Thus, the LEDs and diode lasers based on II–VI semiconductors that require a contact to a p-doped material (e.g., ZnSe) will not be practical without a means for forming low resistance ohmic contacts to the p-doped material.

Thus, there is a need to develop II–VI based semiconductor LEDs and diode lasers that emit light in the blue and blue-green portion of the spectrum and do not suffer from the above-mentioned problems. In addition, there is a need to develop a low resistance ohmic contact to such devices when they require a contact to a p-type material.

SUMMARY OF THE INVENTION

The present invention is directed to II–VI compound semiconductor light emitting devices which overcome the prior art problems associated with equilibrium grown crystals such as strain related defects, inadequate operation at room temperature and device failure due to excess heating at the contact. In one embodiment of the present invention, a II–VI heterostructure is formed on a buffer layer of a III–V semiconductor which is formed on a III–V compound semiconductor substrate of a first conductivity type. The II–VI heterostructure includes at least one quantum well region comprised of a quantum well layer sandwiched between first and second barrier layers. The quantum well layer can be a II–VI compound semiconductor material of the formula $A_xB_{(1-x)}C$ wherein A and B are two different elements from Group II and C is at least one element from Group VI (e.g., (Zn,Cd)Se). The barrier layers can be a II–VI compound semiconductor that has a larger bandgap energy than the quantum well material and lattice matches with the first and second cladding layers (e.g., Zn(S,Se)).

The quantum well region is sandwiched between first and second cladding layers of a II–VI semiconductor material having first and second conductivity types respectively. The first cladding layer is formed on and lattice matched to the III–V buffer layer and the first barrier layer. The second cladding layer is lattice matched to the second barrier layer. An upper portion of the second cladding layer is heavily doped with the second conductivity type to facilitate electrical contacting.

Light emission emanates from the quantum well layer which provides a useful way of confining electrons and holes within its confines. The quantum well confinement ensures that when a voltage is applied, a significant number of electrons and holes interact with each other to produce quasi 2-D excitons (coupled electrons and holes). The resultant 2-D excitons exhibit very strong optical oscillator strengths and binding energies which exceed the optical phonon energy. This large binding energy allows excitons to survive at and above room temperature. As a result, the semiconductor light emitting device of the present invention can be continuously operated as an LED or a laser diode at room temperature. In addition, by utilizing suitable barrier layers (e.g., Zn(S,Se)) to shift the radiation of the present devices from bluish-green into the blue, the present devices are significantly brighter blue sources than SiC or GaN based electroluminescent devices.

When the compound semiconductor light emitting device of the present invention is fabricated using a specific growth sequence beginning with a p-type substrate, a very large lateral electrical conduction mechanism is produced as a result of the potential energy barrier between the III–V buffer layer and the first cladding layer. This mechanism provides a significant advantage when the present II–VI heterostructures are operated as an LED. More specifically, the large lateral current spread allows a point contact to produce a large emission area which allows spatial features to the light emitting region to be easily defined. For example, a layer of insulator can be deposited on the second cladding layer followed by conventional photolithographic and etching techniques to expose the heavily doped portion of the second cladding layer. Next, a transparent electrode is deposited which contacts the heavily doped layer through the opening in the insulator layer. Due to the large lateral electrical conduction, the transparent electrode only needs to be point contacted (typically outside of the emission region) and light will be emitted through the top electrode as defined by the opening in the insulator layer.

When the light emitting device is formed on an n-type substrate, the second cladding layer will be p-type. The conventional contacts to a p-type II–VI material, e.g., Au, which does not form an ohmic contact to ZnSe, causes excess heating problems during operation which can lead to device failure. To overcome this problem the present invention includes a graded bandgap contact to contact the p-type second cladding layer. The graded bandgap contact provides a low resistance ohmic contact to the p-type second cladding layer, reduces heat at the contact, lowers operating voltages, improves room temperature operation and extends the life of the device.

The graded bandgap region is sandwiched between first and second p-type II–VI semiconductor materials (when used with the present II–VI light emitting devices, the second p-type material can be the second cladding layer). The graded bandgap region can be a single continuously graded region (e.g. Zn(Se,Te)) or a plurality of cells of equal thickness to simulate a continuously graded region. In both cases, the idea is to effectively spread out the transition between the first and second p-type II–VI semiconductor materials such that there is no barrier to the injection of holes into the second p-type II–VI layer thereby providing an ohmic contact thereto. For the latter embodiment, each cell includes a layer of the first p-type II–VI semiconductor material and a layer of the second p-type II–VI semiconductor material. The thicknesses of the first and second p-type layers are gradually varied from cell to cell to approximate a graded bandgap region.

In another embodiment for the ohmic contact, the continuously graded bandgap region is modified to reduce lattice mismatch and dislocation densities occurring in the graded region due to the thickness of the overlying layers. This modified graded bandgap region, which comprises a continuously graded alloy (e.g. Zn(Se,Te)) or a pseudo-graded alloy, takes advantage of the non-linear bandgap energy profile which follows a quadratic function and is dependent upon the per cent mole fraction of one group VI element of the II–VI ternary alloy used. When that per cent mole fraction of the group VI element of the alloy is achieved in the linearly graded bandgap region that will effect the desired bandgap energy (for e.g. 37% mole fraction of Te in Zn(Te,Se)), then the grading of the II–VI compound comprising the bandgap region will be truncated, and the remaining structure of the contact region will consist of either the II–VI alloy compound having the desired mole fraction per cent of the group VI element, or, the second p-type II–VI layer of only a few monolayers in thickness. The resulting reduction in thickness of the graded bandgap region that achieves the desired bandgap energy enables a reduced thickness in the top p-type II–VI semiconductor material to which a metal contact is attached. The reduced thickness of the overall structure reduces occurrence of lattice mismatch and propagation of threading dislocations into the active region of the light emitting device, thereby improving device efficiency.

The II–VI compound semiconductor light emitting devices of the present invention including the graded bandgap contact can be fabricated in a molecular beam epitaxy system which provides separate growth chambers for the III–V and II–VI epilayer growth. The insulator layer can be deposited and etched by conventional techniques and the transparent top electrode can be deposited using an rf magnetron sputtering system.

Another embodiment of the present invention is directed to a monolithic multicolor light emitting element which includes four II–VI semiconductor light emitting devices formed on a single substrate. The multicolor element is capable of emitting four different colors. Each of the four devices includes all the elements of the blue emitting II–VI device described above. The first device is identical to that described above for blue emission. The second device includes an atomic monolayer of ZnTe in the quantum well layer or Te continuously distributed throughout the well to shift the wavelength of emission to the green. The third device includes Mn dispersed throughout the quantum well and provides for yellow emission. The fourth device includes the atomic monolayer of ZnTe or Te distributed throughout the quantum well as well as the Mn and provides red emission.

A further embodiment of the present invention is directed to a method of fabricating the monolithic multicolor light emitting element. Each of the four II–VI light emitting devices can be fabricated adjacent to each other in a monolithic fashion on a common substrate by using MBE growth combined with selective area masking. The atomic monolayer of ZnTe or the continuous distribution of Te throughout the quantum well can be grown by atomic layer epitaxy (ALE) or migration enhanced epitaxy (MEE). Display configurations can be defined for any desired images using conventional lithography and etching techniques to deposit insulator layers and define emission regions. In addition, as a result of lateral current spreading, transparent electrodes can be utilized which only need to be point contacted while allowing emission through the electrode.

BRIEF DESCRIPTION OF THE DRAWINGS

FIG. 9(a) is a schematic drawing showing the cross-section of the graded bandgap ohmic contact 46 of the present invention fabricated as a single layer and as a plurality of cells and an energy band diagram of a p-type graded bandgap layer of Zn(Se,Te) disposed between a layer of ZnTe and a layer of ZnSe.

FIG. 9(b) is a schematic drawing showing the cross-section of the modified graded bandgap ohmic contact 46' of the present invention fabricated as a single layer and as a plurality of cells.

DETAILED DESCRIPTION OF THE INVENTION

Figure 1:
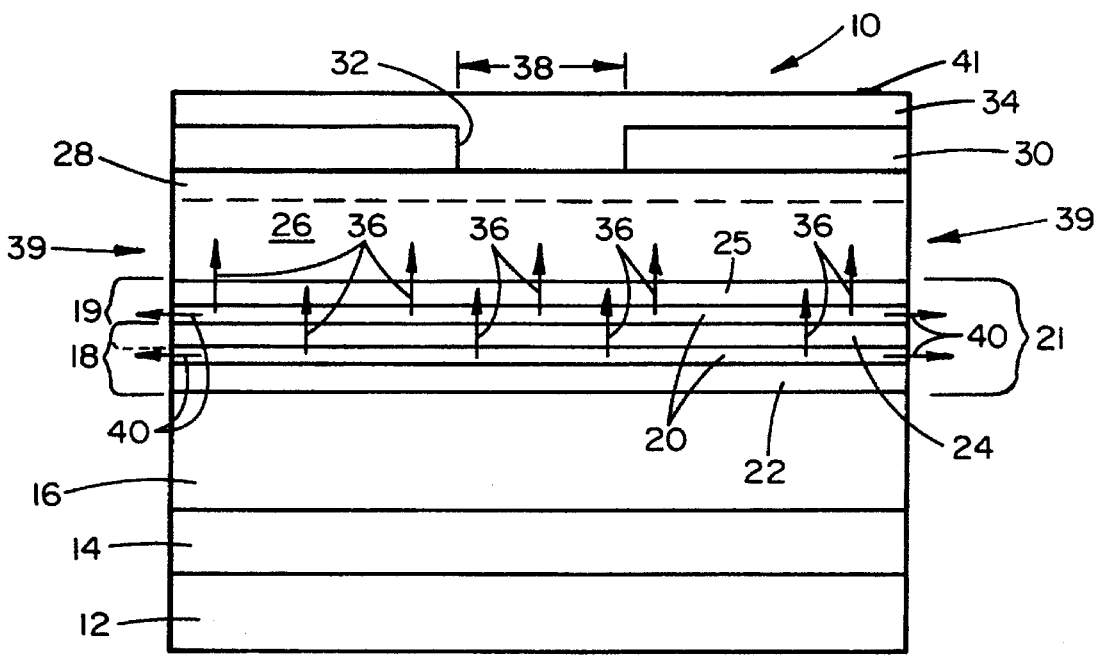
FIG. 1 is a schematic drawing showing the cross-section of a II–VI compound semiconductor light emitting device according to the present invention.
Figure 2:
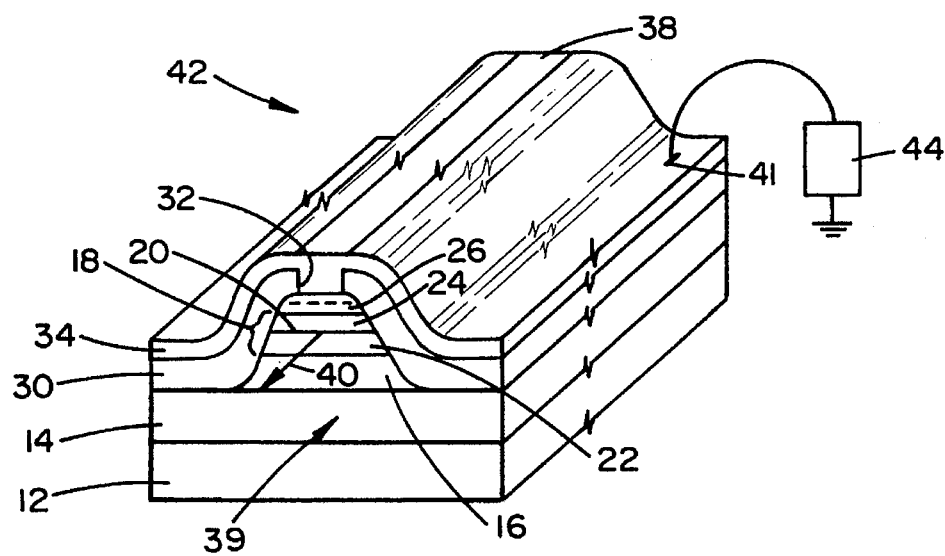
FIG. 2 is a schematic perspective view of the II–VI compound semiconductor light emitting device of FIG. 1 having one quantum well region and fabricated as a mesa structure.

Referring to FIGS. 1 and 2, there is shown one embodiment of a semiconductor light emitting device 10 of the present invention based on Group II–IV compound semiconductor materials. The device 10 is formed on a substrate 12 of a Group III–V compound semiconductor material having a first conductivity type. An epitaxial buffer layer 14 of the III–V compound semiconductor material can be formed on substrate 12 to enhance the crystal quality of the subsequent II–VI structure but layer 14 is not essential to realizing the devices of the present invention. A first cladding layer 16 of a II–VI compound semiconductor material is disposed on the epitaxial layer 14. The epitaxial layer 14 and cladding layer 16 are also of the first conductivity type. The epitaxial layer 14 and the first cladding layer 16 are lattice matched such that there are no defects at the interface between layers 14 and 16.

As employed herein, lattice matching refers to growing one material upon another material in a pseudomorphic manner. More specifically, the lattice constants of the two materials are equal at the growth temperature but are not equal at room temperature, after cooling. The mismatch at room temperature is relieved by strain in the grown material but there are no dislocations or defects.

At least one quantum well (QW) region 18 is formed on the first cladding layer 16. For illustrative purposes, FIG. 1 shows a multiple quantum well (MQW) region 21 comprising two quantum well regions 18 and 19. Each quantum well region 18, 19 consists of a quantum well layer 20 sandwiched between first and second barrier layers 22, 24 and 24, 25 respectively with barrier layer 24 being a second barrier layer for QW region 18 and a first barrier layer for QW region 19. It should be understood that in the illustrative example shown in FIG. 1, the multiple quantum well region 21 consists of alternating barrier and quantum well layers such that the number of QW layers is one less than the number of barrier layers. The barrier layer 22 is lattice matched to the first cladding layer 16 and barrier layer 25 is lattice matched to the second cladding layer 26. The quantum well layer 20 does not have to be lattice matched to its adjoining barrier layers 22 and 24. Since the well layer 20 is so thin that it may remain pseudomorphic and in any case any dislocations in the well layer 20 will not have a significant impact on device performance.

The conductivity type of the barrier layers 22 and 25 can be of the same conductivity type as that of the first and second cladding layers 16 and 26 respectively. The conductivity type of any barrier layers between layers 22 and 25, for example barrier layer 24 can be of either conductivity type. As an example, if there were six QW regions having seven barrier layers formed on a p-type substrate the lower four barrier layers can be p-type while the upper three barrier layers can be n-type.

The quantum well layer(s) 20 can be a II–VI compound semiconductor material having the formula $A_xB_{(1-x)}C$ where A and B are two different elements from Group II of the periodic table and C is an element from Group VI of the periodic table (e.g., (Zn,Cd)Se which corresponds to a chemical composition of $Zn_xCd_{(1-x)}Se$). Depending upon the type of substrate (lattice constant) and the desired wavelength of LED or laser emission, the value of x representing the proportions of elements A,B in material $A_xB_{(1-x)}C$ may range anywhere from 0 to 1 and are adjustable to achieve an appropriate bandgap energy level. When there are two elements from Group VI present in the semiconductor material of well layer(s), C represents a formula $D_yE_{(1-y)}$ where D and E are two different elements from Group VI (e.g., well layer(s) 20 can be ZnCdSSe which corresponds to a chemical composition of $Zn_xCd_{(1-x)}S_ySe_{(1-y)}$. Again, depending upon the type of substrate (lattice constant) and the desired wavelength of LED or laser emission, the value of y representing the proportions of elements D,E used in material $A_xB_{(1-x)}D_yE_{(1-y)}$ may range anywhere from 0 to 1 and are adjustable to achieve an appropriate bandgap energy level. The barrier layers 22, 24 and 25 can be a II–VI compound semiconductor material that has a larger bandgap energy than the material of the quantum well 20 and lattice matches with the first and second cladding layers 16 and 26. The first and second cladding layers 16, 26 are also chosen to be a II–VI semiconductor material that lattice matches with the barrier layers 22, 25 and the buffer layer 14.

A second cladding layer 26 of the II–VI compound semiconductor material having a second conductivity type is formed on the quantum well region 18. The second cladding layer is lattice matched to the barrier layer 25. An upper portion 28 of the second cladding layer 26 is heavily doped with a second conductivity type impurity (e.g., Al, Cl, Br or I to produce n-type or Li, Na or N to produce p-type). The doping level in the upper portion 28 is increased as compared to that of the second cladding layer 26 to lower the contact resistance as well as contribute to lateral transport as described below.

Light emission emanates from the quantum well layer(s) of the present semiconductor light emitting devices. The quantum well layer(s) provide a useful way of confining electrons and holes within its extremely narrow confines. As a result, even when a voltage is applied, the quantum well confinement enhances electron-hole coulomb interaction in the well layer—creating the 2-D equivalent of a hydrogen atom. The resultant quasi 2-D excitons (coupled electron-hole) have extremely high binding energies (40 meV). The excitons are referred to as quasi-2D because the thickness of the well layer (typically 75Å) is equivalent to a 2-D sheet and since the excitons are confined therein they are equivalent to a 2-D exciton. At high levels of current injection and at sufficiently higher temperatures, the electrons and the holes become independent particles.

The excitonic transitions in the QW layer(s) 20 dominates the quantum well absorption spectra at the lowest n=1 heavy hole (HH) resonance well above room temperature. This robustness of the exciton against the generally very strong longitudinal optical (LO) phonon induced dissociation in bulk II–VI semiconductors is made possible by the enhancement in the exciton binding energy ($E_x$) by confinement of excitons to the thin QW layer(s) so that $E_x$ is greater than the (LO) phonon energy ($h_{Lo}$), an unusual circumstance encountered neither in GaAs quantum wells nor bulk ZnSe. The condition that $E_x > h_{Lo}$ ensures that quasi-2D excitons dominate the spontaneous emission. In addition, the large exciton binding energy allows excitons to survive up to room temperature and beyond—a feature which prior to the present invention had not been achieved in II–VI based semiconductor light emitting devices—thereby providing an enhancing mechanism for room temperature operation of the present semiconductor light emitting devices. In addition, as a result of the efficient interaction of electrons and holes due to the QW confinement and the extremely high binding energy of the excitons, the lasers and LEDs of the present invention produce larger and more efficient photon production than red, infrared and III–V based lasers and LEDs.

Electrically contacting the device 10 can be provided by depositing an insulator layer 30 on the II–VI heterostructure 10 and then etching by conventional photolithographic masking and etching techniques to define a contact stripe opening 32. A contact electrode 34 is then deposited on the insulator layer 30 and in opening 32. The electrode 34 contacts the heavily doped portion 28 of the second cladding layer 26 through the opening 32. When the heavily doped portion 28 has an n-type conductivity, suitable materials for electrode 34 include indium tin oxide (ITO), gold and indium. When the heavily doped portion 28 has a p-type conductivity, the graded bandgap contact of the present invention (described below) is preferred over indium, gold and ITO.

Suitable materials for the quantum well layer(s) having formulas $A_xB_{(1-x)}C$ or $A_xB_{(1-x)}D_yE_{(1-y)}$ include ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe. Suitable materials for the barrier layers 22, 24 and 25 and cladding layers 16, 26 include ZnSSe, ZnSe, ZnMnSe, ZnMnSSe, ZnSTe, ZnTe, ZnMnTe and ZnMnSTe. In addition, the barrier layers 22, 24 and 25 can be the same compounds used for the well layer(s) where the choice of the barrier layer material is made by choosing one of the compounds listed and/or its composition such that the bandgap of the barrier layer is larger than that of the well layer(s).

Any of the above listed materials for the quantum well layer(s) 20 can be used with any of the above listed materials for the barrier and cladding layers provided that the II–VI semiconductor material of the barrier layers 22, 24 and 25 is (1) lattice matched to the II–VI semiconductor material of the cladding layers, i.e., the barrier layers are pseudomorphic to the cladding layers, and (2) has a larger bandgap energy than that of the quantum well layer(s). In addition, various III–V compound semiconductor materials can be used for the substrate 12 provided the chemical composition of the cladding and barrier layers is adjusted to provide a wavelength of emission corresponding to blue light. Various materials can also be used for buffer layer 14 provided that it lattice matches with the first cladding layer 16.

As an illustrative example of the light emitting device 10 of the present invention, the substrate 12 can be p-GaAs (or n-GaAs, n-(In,Ga)As or K-Ga(As,P)). The optional buffer layer 14 can be an epitaxial p-GaAs, p-(In,Ga)As or p-Ga(As,P) (or n-GaAs, n-(In,Ga)As or n-Ga(As,P)) layer having a thickness of between 1.0–2.0 µm and a doping level of $1\times10^{18}$ cm$^{-3}$. The first cladding layer 16 can be p-Zn(S, Se) (n-Zn(S,Se)) ($0.07 \leq x \leq 0.08$) having a thickness of 2.0 µm and nitrogen doped to a level of $4\times10^{17}$ cm$^{-3}$. The quantum well region 18, can be (Zn,Cd)Se well layer 20 having a Cd concentration of between 12% and 20% sandwiched between p-Zn(S,Se) (n-Zn(S,Se)) ($0.07 \leq x \leq 0.08$) barrier layers 22, 24. (If a different III–V semiconductor material were used for substrate 12 then the sulfur and content of the barrier and cladding layers would have to be adjusted as described above.) The MQW region 21 can consist of six such quantum wells regions 18 with the wells being 75Å thick and the barrier layers being 100Å thick. The second cladding layer 26 can be a 1.4 µm n-Zn(S,Se) (p-Zn(S,Se)) layer chlorine doped to a level of $5\times10^{17}$ cm$^{-3}$ having a 1,000Å upper portion 28 doped to a level of $1\times10^{18}$ cm$^{-3}$ to facilitate contacting. To simplify device fabrication and lattice matching, the layers 22, 24, 25 and 26 were chosen to have the same sulfur fraction as the first cladding layer 16.

As shown from the illustrative example above, the first barrier layer of the Quantum Well may be the same II–VI compound as the first cladding layer, or, it may be different. As long as lattice matching between the two layers is achieved and the index of refraction of the barrier layer is greater than that of the quantum well layer (i.e. higher energy bandgap) to ensure sufficient optical confinement, either embodiment is acceptable.

As shown in FIG. 2, the light emitting device of the present invention can be a light emitting diode fabricated as a mesa structure 42. (For illustrative purposes, the device 42 of FIG. 2 only has one QW region 18 having the well layer 20 disposed between first and second barrier layers 22 and 24.) To fabricate the mesa structure, the II–VI heterostructure is etched down to the buffer layer 14 such that the II–VI heterostructure has a smaller width than the substrate 12. As a result, the insulator layer 30 is deposited on the II–VI heterostructure as well as a portion of the buffer layer 14.

The light emitting diode 42 can emit in the blue (490–494 nm) at room temperature under continuous wave excitation which can readily be obtained after a sufficient initial voltage is applied from voltage source 44. This voltage is typically between about 4–15 V depending on the contact scheme used and the continuous wave output power is in excess of 120 µW at room temperature. LED emission from the device of the present invention originates from the quantum well layer(s) 20 and is excitonic in origin. The carrier confinement is so strong in the quantum well region that excitons have extremely high binding energies (40 meV).

Figure 3:
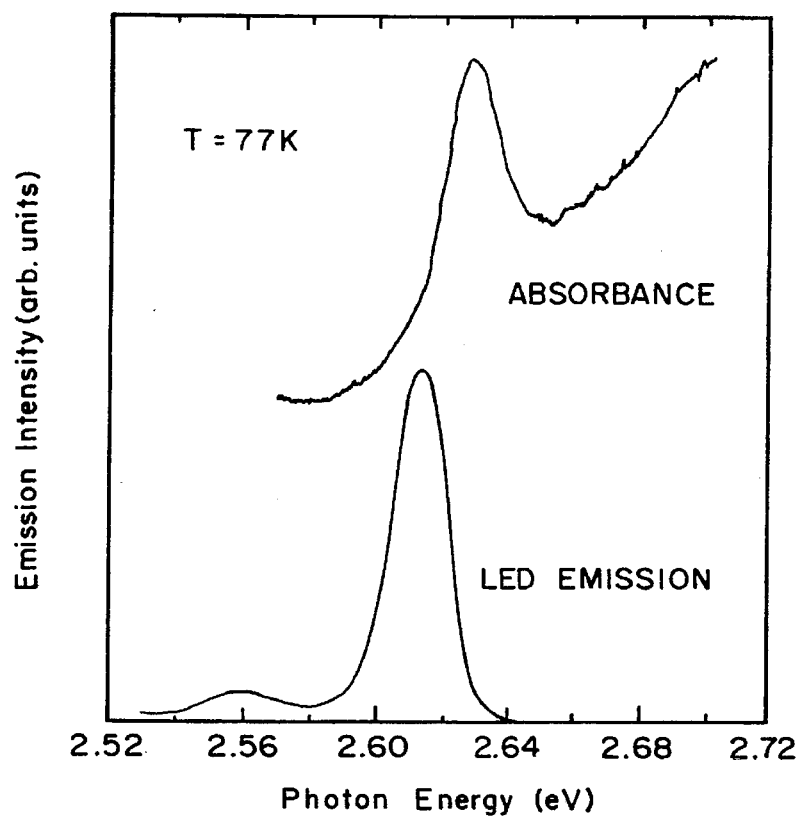
FIGS. 3–4 are diagrams showing a comparison between the exciton absorption and the continuous wave (CW) electroluminescence (EL) emission spectrum near the n=1 HH exciton resonance of a light emitting diode according to the present invention at T=77K and T=300K.
Figure 4:
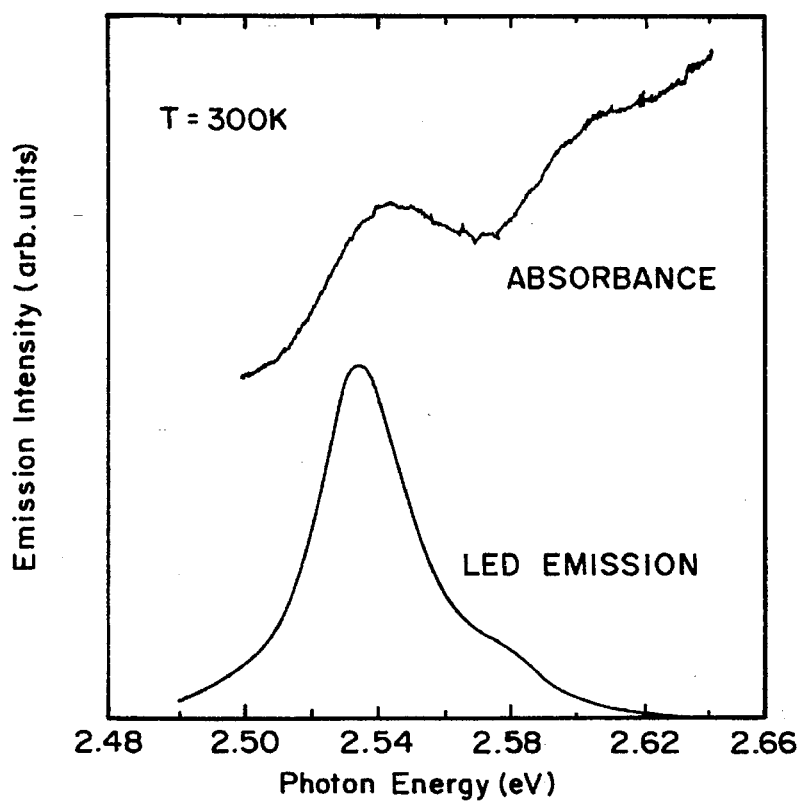

FIGS. 3–4 show a comparison between the continuous wave (CW) electroluminescence (EL) spectrum and exciton absorption near the n=1 heavy hole (HH) exciton resonance of the light emitting device 42 operating as an LED. The quantum well regions comprised (Zn,Cd)Se well layers and Zn(S,Se) barrier layers. The stimulated emission emerges directly from spontaneous emission spectra in the n=1 HH exciton region at T=77K and T=300K pumped under steady state conditions. The close spectral correlation between exciton absorption and the emission spectra which, given the exciton binding energy of 40 meV shows that the T=77K and the room temperature (T=300K) LED emission is of excitonic origin and is attributable to the (Zn,Cd)Se quantum wells. This phenomenon is normally not encountered in III–V semiconductor light emitting devices since the binding energy (40 meV) in the light emitting device of the present invention is approximately one order of magnitude greater than that which is exhibited in III–V based structures. As stated above, due to the enhancement of the exciton binding energy by quantum well confinement in the present wide bandgap II–VI light emitting device (so that the exciton binding energy exceeds the LO phonon energy), Coulomb correlated excitons (electron-hole pairs) can be maintained up to room temperature.

When the semiconductor light emitting device of the present invention is fabricated as an LED, the electrode 34 is preferably ITO because it is a transparent electrode and forms a better ohmic contact to n-type portion 28 than indium or gold. An ITO electrode has the advantage of allowing the quantum well emission 36 to be viewed through the top contact layer 26 over a wide area for display applications (the absorption of the contact layer 26 is small). The insulator layer 30, opening 32 and transparent electrode 34 define spatial features to the light emitting region 38 thereby permitting the emission through the top. It should be understood by those skilled in the art that the spatial features can be tailored to a particular design requirement by shaping the opening 32 using conventional photolithographic and etching techniques. For example, such standard techniques can be used to define a seven segment numeric display device.

When gold or indium are used for the electrode 34, the device 10 of FIG. 1 can also operate as an LED by fabricating the structure into a rectangular or square shape with or without cleaved end facets 39. In this embodiment, the light region is as shown by the arrows 40.

Another feature of the present invention is a very large lateral electrical conduction (current spread) which originates from the potential energy barrier at the interface between the buffer layer 14 and the first cladding layer 16. This feature is present for the II–VI heterostructures of the present invention grown on a p-type substrate 12 and is very useful when the device of the present invention is fabricated as an LED. As an illustrative example, the substrate 12 and buffer layer 14 can be p-GaAs and the cladding layer 16 can be p-Zn(S,Se). The lateral current spread allows the contact layer 26 to be only contacted locally with for example, a small indium contact 41 while the current spreads over a much wider area the entire MQW region 21). Thus, the light emission 36 also emerges from this wider area as well. As shown in FIG. 1, when the top electrode 34 is a transparent electrode, the contact 41 can be placed outside the spatially defined emission region 38 and due to parallel conduction, the emission emerges from the entire region 38. Lateral electrical conduction combined with the transparent top electrode 34 allow conventional photolithographic etching techniques to be used to define spatial features to the light emitting region 36 for a wide variety of LED applications.

The II–VI light emitting devices 10 and 42 of the present invention can also be used as a diode laser by fabricating the device 10 and 42 into long and narrow structures typically having a width between 20 and 50 μm and a length between 500 μm and 1 mm. Referring to FIG. 2, the mesa width for the laser is much narrower than that for the LED device (for example, 20 μm for the laser and 2 mm for the LED device). In addition, in contrast with the LED, the laser 42 must have cleaved end facets 39 and the emission of interest regardless of the type of electrode (indium, gold or ITO) used is the edge emission as shown by arrows 40. Laser operation for the laser diode 42 without coated facets is produced by applying pulsed or continuous wave current injection to the device 42 by any well known source 44. The diode laser 42 emits blue and or blue green light and the turn on voltage for forward conduction is typically between 12 and 30 V. Under pulsed or continuous wave excitation, the laser 42 can be readily operated up to and including room temperature conditions. Continuous wave operation was obtained from a heat sinked (Zn,Cd)Se/Zn(S,Se) based device fabricated on a p-GaAs substrate. The typical output power at continuous wave operation was 5 mW.

Figure 5:
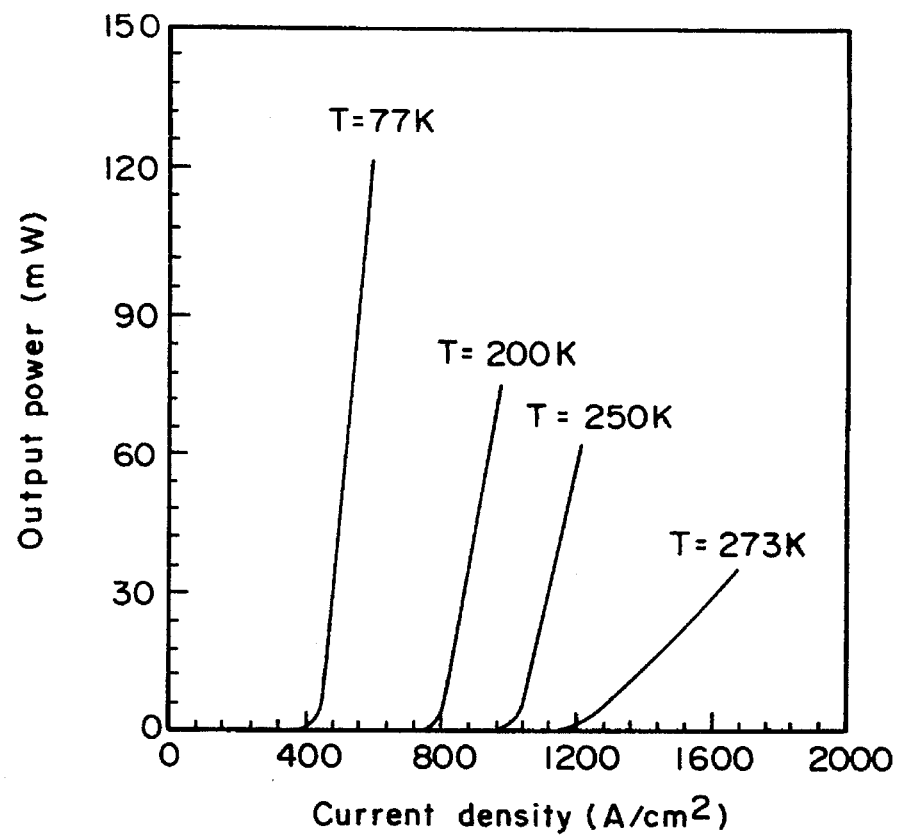
FIG. 5 is a diagram showing a relationship between the pulsed diode laser output power and the current density of a pulsed diode laser with uncoated facets according to the present invention from T=77K to T=273K.
Figure 6:
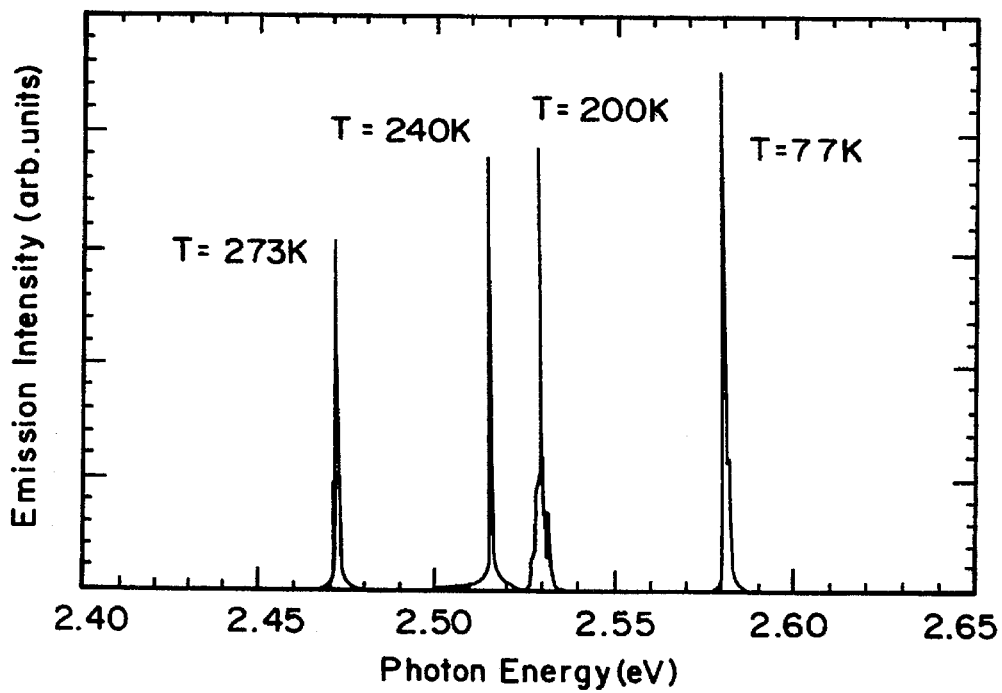
FIG. 6 is a diagram showing the EL emission spectrum in the n=1 HH exciton region for the pulsed diode laser of FIG. 5 from T=77K to T=273K.

As with the LED device, laser emission originates from the quantum well layers and can be excitonic in origin. Laser emission emerges directly from the spontaneous emission spectra within the n=1 HH exciton region at T=77K and T=295K. An excitonic mechanism can aid in increasing the oscillator strength of the QW transition and hence partly offset the relatively modest p-type doping level ($=4\times10^{17}$ $cm^{-3}$) in the present II–VI heterostructure. FIG. 5 shows the pulsed diode laser output power vs. input current density from T=77K to 273K for the mesa diode laser with uncoated facets wherein the quantum well regions comprise (Zn, Cd)Se well layers disposed between Zn(S,Se) barrier layers. FIG. 6 shows the emission spectra from T=77K to T=273K for the same device in the n=1 HH exciton region (n+ZnSe contact layer 26). The current pulse duration was varied between 100 and 500 ns. The current threshold density at T=77K was 400 A/$cm^2$ or 160 mA. Without any particular effort at heat sinking beyond attaching the GaAs substrate to a copper block, these devices have been operated to a duty cycle as high as 50% with 2–3 mW average output power levels.

Figure 7:
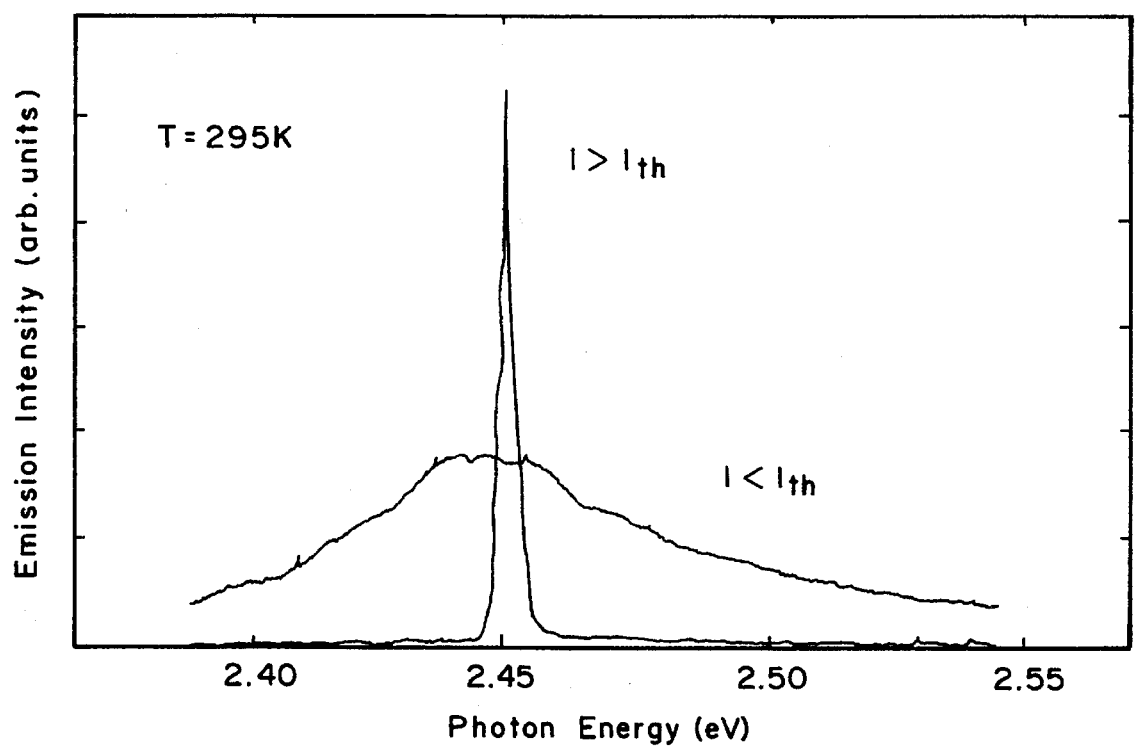
FIG. 7 is a diagram showing the EL emission spectrum in the n=1 HH exciton region of a pulsed diode laser with coated facets according to the present invention at T=295K.
Figure 8:
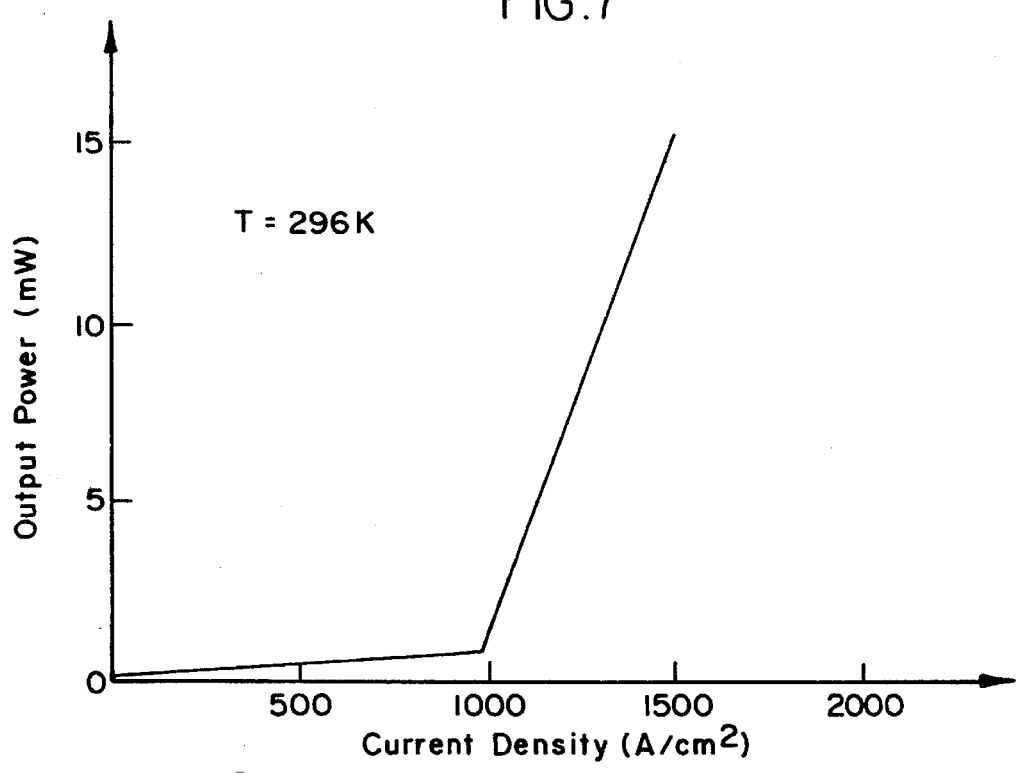
FIG. 8 is a diagram showing a relationship between the pulsed diode laser output power and the current density for the pulsed diode laser of FIG. 7 at T=295K.

Approaching room temperature (at a wavelength of 490–494 nm) the threshold current density increased to 1,500 A/$cm^2$ (corresponding to 600 mA actual current). Typically as room temperature conditions are approached (beyond 250K) the heating due to the non-ohmic contacts (with either gold or indium used as electrodes 34) rapidly escalate thermal problems. The performance of the present pulsed diode laser under room temperature conditions can be readily increased utilized ITO as the top electrode or by providing facet coating or other forms of increased feedback. For example, FIGS. 7 and 8 demonstrate the room temperature pulsed output characteristics of the diode laser of the present invention with coated facets. FIG. 7 shows the emission spectra at T=295K for the (Zn,Cd)Se/Zn(S,Se) QW laser diode of the present invention in the n=1 HH exciton region. FIG. 8 shows the output power versus the current density for the same pulsed diode laser. As shown in FIG. 8, the threshold current density is approximately 1 KA/$cm^2$.

A method for fabricating the II–VI compound semiconductor light emitting device of the present invention will now be described with reference to FIGS. 1 and 2. The method will be described with regard to fabricating the device on a p-type substrate but it should be understood by those skilled in the art that the techniques described below can equally be applied to fabricating the device on an n-type substrate.

The II–VI heterostructures of the present invention can be grown in a molecular beam epitaxy (MBE) system which provides separate growth chambers for the II–VI and III–V epilayer growth. An ultrahigh vacuum (UHV) transfer tube connects the two growth chambers. The transfer under UHV conditions minimizes the contamination of the surface of the III–V epilayer prior to II–VI epilayer growth. The device of the present invention can be grown on a p doped GaAs substrate 12 which is chemically cleaned using conventional techniques and introduced into the III–V chamber for the growth of the optional p-GaAs buffer layer 14. The p-GaAs buffer layer 14 can be grown at a substrate temperature of 580° C. (520° C. for n type). The buffer layer was doped using Be (p- type) (or PbTe n-type).

Next the III–V buffer layers can be transferred to the II–VI growth chamber under an ultrahigh vacuum and then heated to about 400° C. for calibration of the thermocouple to the optical pyrometer. The pyrometer had previously been calibrated to the GaAs oxide desorption temperature of 582° C. The GaAs epilayer temperature was set between 240°–245° C. for nucleation of the II–VI structures. The flux for the growth of both (Zn,Cd)Se and Zn(S,Se) compounds were measured using a water coded quartz crystal monitor placed at the substrate position. Elemental sources can be used for Zn, Se and Cd. Typical flux ratios used for the (Zn,Cd)Se (x=0.12) were 1.4 for (Zn+Cd)/Se and 5.5 for Zn/Cd. The p-GaAs buffer layer 14 was lattice matched to the Zn(S,Se) cladding layer 16 by incorporating a sulfur fraction of approximately 7% in the Zn(S,Se) layer 16.

The Zn(S,Se) layers were grown by MBE using a ZnS compound source in combination with appropriate Se and Zn fluxes. Typical Se and Zn fluxes are between $3\times10^4$ and $5\times10^{14}$ Atoms/cm$^2$ sec. Chlorine from a ZnCl$_2$ source was used as the n-type dopant while nitrogen from a rf plasma source was used as the p-type dopant. The dopants were also introduced into the center region (typically 50Å) of the barrier layers 22 and 24. In the example described herein, the doping in the QW region 18 was p-type although similar results can be obtained with n type doping. The doping level in the n doped layer 26 can be between $1\times10^{17}$ cm$^{-3}$ to $1\times10^{18}$ cm$^{-3}$. Typically, the Cl doped n type layer 26 had a free carrier concentration of $5\times10^{17}$ cm$^{-3}$ which is increased to $1\times10^{18}$ cm$^{-3}$ in the heavily doped portion 28 which can be 1000Å thick.

A layer of polyamide 30 is deposited on the II–VI heterostructure 10 and etched to define the opening 32 by conventional deposition and etching techniques. For example, CVD can be used to deposit layer 30 followed by wet chemical etching to form opening 32. Next, an ITO electrode 34 is deposited on the layer 30 and contacts the contact layer 28 through opening 32. The use of etching followed by the deposition of the transparent top electrode material defines spatial features to the light emitting region 38 while permitting the emission through the top.

The ITO layer 34 can be deposited using an rf magnetron sputtering system which is equipped with a pressed oxide target of composition 90 wt % In$_2$O$_3$-10 wt % SnO$_2$. The sputtering gas is a mixture of argon and oxygen, the latter comprising approximately 4% of the mixture. The total pressure was typically 4 mTorr. A deposition rate of approximately 20Å/S was used to produce 3000Å thick films with typical resistivities of $9\times10^{-4}$ cm, and absorption losses estimated to be about 10% in the 480–500 nm spectral range.

When the present II–VI heterostructures are grown on an n type substrate there is a need to contact the p-type layer 28. Gold forms a better contact to a p-type layer than indium and ITO. However, even when gold is used, there is a disadvantage that as room temperature conditions are approached, the heating due to the non-ohmic gold contact to the p- type layer 28 rapidly escalates thermal problems and can lead to device failure. In order to overcome this disadvantage and to provide a low resistance ohmic contact, the present invention includes a graded heterostructure contact to p-type II–VI compound semiconductor such as p-Zn(S,Se) or p-ZnSe.

Turning to FIG. 9(a), there is shown the ohmic contact 46 of the present invention along with the energy band diagram. The contact 46 includes a continuously graded bandgap region 47 sandwiched between first and second layers 48, 50 of first and second p-type II–VI compound semiconductor materials. As an illustrative example, the first II–IV material 48 can be p-ZnTe and the second II–VI material 50 can be p-ZnSe or p-Zn(S,Se). A Zn(Se,Te) graded alloy in region 47 would then yield the band structure shown in FIG. 9(a). As an alternative to the continuous linear grading shown in FIG. 9(a), a continuous non-linear grading can also be utilized. The graded bandgap Zn(Se,Te) alloy having the band structure shown in FIG. 9(a) can be fabricated by MBE or other epitaxial methods by utilizing appropriate fluxes for the Zn, Te and Se fluxes.

When a voltage is applied to the contact 46, holes are injected from the heavily doped p-type layer 48 to the layer 50 via the graded bandgap region 47. The graded bandgap contact 47 effectively spreads out the transition barrier between the first p-type II–VI semiconductor 48 (e.g. ZnTe) and the second p-type semiconductor 50 (e.g. ZnSe) such that there is no barrier to the injection of holes into the second p-type layer 50. By sandwiching the graded bandgap Zn(Se,Te) layer 47 between the ZnTe and ZnSe layers 48, 50, the graded contact eliminates the valence band offset ($\approx$1 eV) between a heterojunction of ZnTe and ZnSe which forms a barrier to hole injection.

In another embodiment of the graded bandgap contact 46 of the present invention, the single graded bandgap alloy 47 can be replaced by a pseudo graded bandgap region 49 which approximates the linearly graded band structure shown in FIG. 9(a) by a multilayer structure having a plurality (n) of cells $C_1 \ldots C_n$. Each of cells $C_1 \ldots C_n$ is of approximately the same thickness (of at least 10Å or more) and includes a layer 52 of the first II–VI semiconductor material and a layer 54 of the second II–VI semiconductor material. In each cell the thickness of the respective p-type layers 52, 54 are varied to approximate a graded bandgap region. The cell $C_1$ adjacent the layer 50 has a layer 52 with a first thickness and proceeding from right to left the thickness of the layers 52 increase in each cell. Conversely, proceeding from right to left the thickness of each layer 54 in each cell decreases. For example, the graded bandgap region 49 can consist of 17 cells each approximately 20Å in thickness. The first cell $C_1$ can contain 18Å of the second p-type II–VI semiconductor (e.g., ZnSe) and 2Å of the first p-type II–VI semiconductor (e.g., ZnTe), the next cell $C_2$ 17Å of the second II–VI semiconductor and 3Å of the first p-type II–VI semiconductor and so on until the last cell $C_n$, which can comprise an 18Å thick layer 52 of the first p-type II–VI semiconductor (e.g., ZnTe) and a 2Å thick layer 54 of the second p-type II–VI semiconductor (e.g., ZnSe), is grown.

Whereas the graded bandgap contacts to ZnSe-based II–VI wide bandgap semiconductors heretofore described each exhibit considerable success in improving the resulting laser and LED device performance, imperfections such as lattice mismatching can still exist up to levels approaching 7% which may potentially degrade device performance. For instance, it is known that defects such as threading dislocations and stack faults exist when the thickness of ZnTe on ZnSe exceeds a few monolayers. The resulting depletion regions at surrounding dislocations, and the resultant coalescence of depletion regions in the presence of a high density of dislocations, can resist the injection of carriers through the graded layers and cause the building up of a high electric field (and therefore introduce an undesirable voltage drop). Furthermore, the presence of dislocations in some region of a device structure presents the potential for those dislocations to propagate into the active region in time, producing a seriously degradation of the device performance. In an effort to alleviate the defect-induced contributions to the device impedance, an additional embodiment of an improved graded bandgap contact has been developed as will be described in detail hereinbelow.

The concept of an improved graded contact, comprised of a graded bandgap region of a p-type group II–VI semiconductor material having a general formula $AB_xC_{1-x}$, for e.g., Zn(Te,Se)), that is sandwiched between a first p-type layer (ZnTe), represented generally as a first group II–VI compound AB and a second p-type layer (ZnSe), represented generally as a second group II–VI compound AC, has, as its basis, the fact that the bandgap energy does not vary linearly from AB to AC, but instead bows such that, as the amount of element B is increased, the bandgap energy at first decreases, reaches a minimum value at a fractional proportion of element B, and then increases as compound AC is approached. Therefor, for the compounds described and in view of FIG. 20, the bandgap energy does not vary linearly from ZnTe to ZnSe, but instead bows such that, as the amount of Te is increased, the bandgap energy at first decreases, reaches a minimum value at a Te fraction of approximately 69%, then increases as ZnTe is approached. This is because the dependence of bandgap energy Eg of that ternary alloy composition (i.e., $ZnTe_xSe_{1-x}$) does not follow a linear relation. Instead the bandgap energy has an approximate quadratic dependence on the fraction x of one element of the alloy and can be described as:

$$Eg_{ZnTeSe}(x) = xEg_{ZnTe} + (1-X)Eg_{ZnSe} - x(1-x)b \quad (1)$$

where b is referred to as bowing parameter. For the $ZnTe_xSe_{1-x}$ compound, the bowing parameter b=1.27 and is a relatively large value as compared to the bowing parameters of other ternary and quaternary II–VI compounds. Depending upon the desired type of mismatch (lattice constant) and the I–V characteristic of the contact, the value of x representing the relative proportions of elements B and C in material $AB_xC_{(1-x)}$ may range anywhere from 0 to 1 and are adjustable to achieve an appropriate bandgap energy level.

Figure 20:
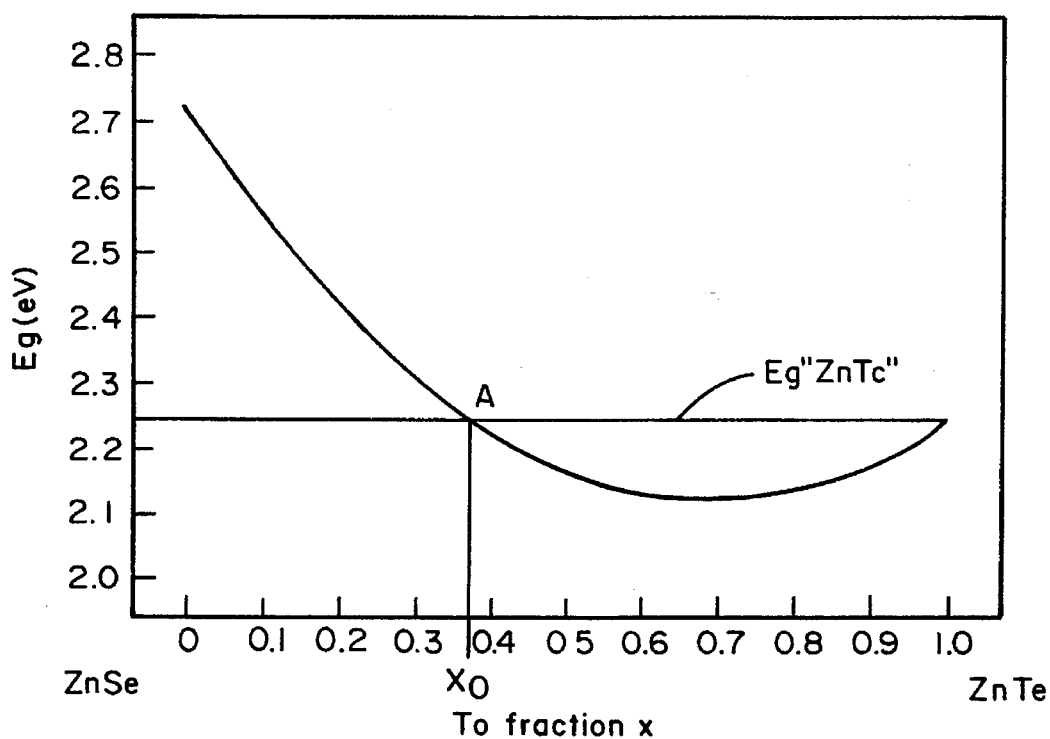
FIG. 20 is a diagram of the energy bandgap of Zn(TeSe) as a function of the per cent concentration of element Te, and further shows a point A where the valence energy bandgap is equal to the bandgap energy of ZnTe.

FIG. 20 illustrates the diagram of bandgap energy $E_{gZnTeSe}$ as a function of the fraction x of Te in the ternary alloy $ZnTe_xSe_{1-x}$ as calculated from Eq. 1. The band energy bandgap of ZnTe, i.e., $Eg_{ZnTe}$, is shown in the figure as approximately 2.25 eV and this is the desired bandgap to be achieved by the graded region. As will be discussed in further detail below, it is not necessary to increase the Te concentration to 100% (as in the original graded bandgap region 47) to reach the desired energy band situation required to gain the electrical advantages of the continuous linearly-graded contact scheme. In fact, the desired bandgap of ZnTe is reached where the Te fraction of the ternary alloy $ZnTe_xSe_{1-x}$ is approximately 37%. The implication is that the structure does not have to incorporate the entire lattice mismatch of 7% between ZnSe and ZnTe in order to obtain the entire bandgap difference between the two binary limits. As a result of not quite reaching the lattice constant of ZnTe, the degree of mismatch in the structure is reduced (to approximately 2.8%), with a corresponding reduction in the dislocation density in the structure.

In view of the foregoing, in order to achieve the reduction of lattice mismatch in the modified linearly graded Zn(TeSe) alloy of region 47' (FIG. 9(b)) the grading of the ternary alloy is halted at point "A", the bowing point, as indicated in FIG. 20. At this point, from simple work function analogy, the metal/Zn(TeSe) (point A) barrier height is similar to that of the metal/ZnTe contact, and the lattice mismatch of the alloy, and subsequently the generation of dislocations, is significantly reduced. This is shown at point "A" in FIG. 20 where $$E_{gZnTeSe}(x_o) = E_{gZnTe} \quad (2)$$

i.e., where the bandgap energies of $ZnTe_xSe_{1-x}$ and ZnTe are equal. Based upon the common cation rule, it is assumed that as a result of the bandgap energies being equal, the valence band energies will also be equal such that:

$$E_{vZnTeSe}(x_o) = E_{vZnTe} \quad (3)$$

Moreover, the effect of composition grading on the conduction energy bands of the compounds may be ignored based on the common cation rule.

To generalize, a value for $x_o$ of the element B of the graded compound $AB_xC_{(1-x)}$ is determined at a point where a valence band energy bandgap of $AB_xC_{1-x}$, $Ev_{ABC}(x_o)$, is equal to the valence band energy bandgap of compound semiconductor material AB, $Ev_{AB}$. For the preferred compound Zn(Te,Se) described herein, the value of $x_o$ is the per cent fraction of element Te in compound $ZnTe_xSe_{1-x}$, and is 0.37.

The improved ohmic contact 46' as shown in FIG. 9(b) includes a p-ZnSe layer 50', which may correspond to the second (or a third) cladding layer of the LED or laser device 10 or 42 when incorporated as an ohmic contact therein. This layer may be alternatively grown on top of the last grown cladding, buffer, or a transition layer that reduces any barrier to hole injection of the p-type ZnSe-based widegap light emitting device 10 or 42. A continuously linearly graded p-type $ZnTe_xSe_{1-x}$ region 47' is subsequently grown on top of layer 50' with the Te fraction x varied from x=0 (ZnSe layer) up to the value $x=x_o$ corresponding to point A, the bowing point. The thickness of alloy region 47' will vary depending upon the grading scheme (whether linear or non-linear) and the fraction of the group VI element necessary to achieve the desired bandgap energy.

The structure of the final p-type II–VI layer 48', which constitutes the layer upon which a metal contact is to be formed, may vary in alternate ways.

First, the layer 48' may comprise the composition of the alloy region having the desired percent mole fraction as described above. For example, after the linearly graded region 47' is halted, the layer 48' of p-type ZnTeSe ($x=x_o$) is grown on top with the metal contact formed on top thereof.

Alternately, an optional layer of heavily doped p-type ZnTe layer of only a few monolayers in thickness may subsequently be grown on top of the ZnTeSe ($x=x_o$) layer 47' with the metal contacted to the heavily doped p-type ZnTe layer. It is desirable that the thickness of the optional ZnTe layer be below the thickness that would generate misfit dislocations in the structure.

Furthermore, the layer 48' may comprise a short-period super lattice structure having alternating thin layers of ZnTe, ZnSe that are grown in a manner to achieve the desired percent fractional proportions of the respective compounds.

As mentioned above, a metal contact comprising one of either gold, palladium, or platinum is subsequently formed on the p-type top layer 48'. It should be noted that the optional step of growing p-type top ZnTe layer 48' is necessary only if the metal contact to p-ZnTe yields a lower contact resistance, possibly due to the difference in maximum attainable doping levels between the binary ZnTe and the compound Zn(Se,Te). The contact metal may be a layer of palladium with gold or alloys of gold deposited on top thereof. Alloys of gold that may be deposited may include metals such as titanium, platinum, etc.

In another embodiment of the modified graded bandgap contact described above, the continuously graded bandgap alloy 47' can be replaced by a pseudo-graded bandgap region 49' which finely approximates the continuously graded band structure 47'. As shown in FIG. 9(b) the pseudo-graded bandgap region 49' of contact 46' comprises a structure having a plurality (n) of cells $C_1 \ldots C_n$. Each of cells $C_1 \ldots C_n$ is of approximately the same thickness (10Å or more) and includes a layer 52' of the first II–VI semiconductor material and a layer 54' of the second II–VI semiconductor material. In each cell the thickness of the p-type layer 52', 54' is varied to approximate the graded bandgap region necessary to achieve the desired bandgap energy level. The cell $C_1$ adjacent the layer 50' has a layer 52" with a first thickness and proceeding from right to left the thickness of the layers 52' increases in each cell. Conversely, proceeding from right to left the thickness of each layer 54' in each cell decreases. For example, the graded bandgap region 49' can consist of 17 cells each of a 20Å thickness. The first cell $C_1$ can contain 18Å of the second p-type II–VI semiconductor (e.g., ZnSe) and 2Å of the first p-type II–VI semiconductor (e.g., ZnTe) the next cell $C_2$ 17Å of the first II–VI semiconductor and 3Å of the second p-type II–VI semiconductor, and so on. Contrary to the structure of the pseudo graded ohmic contact region 49 described above, the number of adjacent cells in the modified pseudo-graded structure (FIG. 9(b)) is terminated at the eighth cell, $C_8$, which comprises approximately 8Å of first p-type II–VI semiconductor material (e.g., ZnTe) and 12Å of second p-type II–VI semiconductor material (e.g., ZnSe). Thus, the approximate per cent mole fraction $X_o$ of Te (37%) is attained, as are the corresponding functional properties as described above with respect to the modified continuously graded region 47'.

The structure of the final p-type II–VI layer 48' of the pseudo graded bandgap contact 46' (i.e. the layer upon which a metal contact is to be formed) is similar to the continuously graded contact 46' described above. For instance, the last cell, $C_8$, of the pseudo-graded region may be repeated several times with the metal contact formed upon the last ZnTe layer to absorb the depletion region produced by the barrier level. Alternately, a 10Å or more thickness of the II–VI compound ZnTe may be formed as could a short-period super lattice. As mentioned above, a metal contact of preferably either palladium and gold or alloys of gold including titanium or platinum, is subsequently formed on top of the last p-type top layer 48'.

The improved linear or non-linear continuously graded and pseudo graded bandgap contacts 46, 46' have been successfully incorporated into ZnSe binary, $ZnS_xSe_{1-x}$ ternary, as well as $A_xB_{1-x}C_yD_{1-y}$ quaternary laser and LED structures, for e.g., $Zn_{1-x}Mg_xS_ySe_{1-y}$. Again, depending upon the desired type of mismatch (lattice constant) and the I–V characteristic of the contact, the values of y representing the proportions of elements D,E used in material $A_xB_{(1-x)}D_yE_{(1-y)}$ may range anywhere from 0 to 1 and are adjustable to achieve an appropriate bandgap energy level. Results show that device performance is improved in nearly every aspect and the lasing voltage at room temperature has been significantly reduced.

Figure 21:
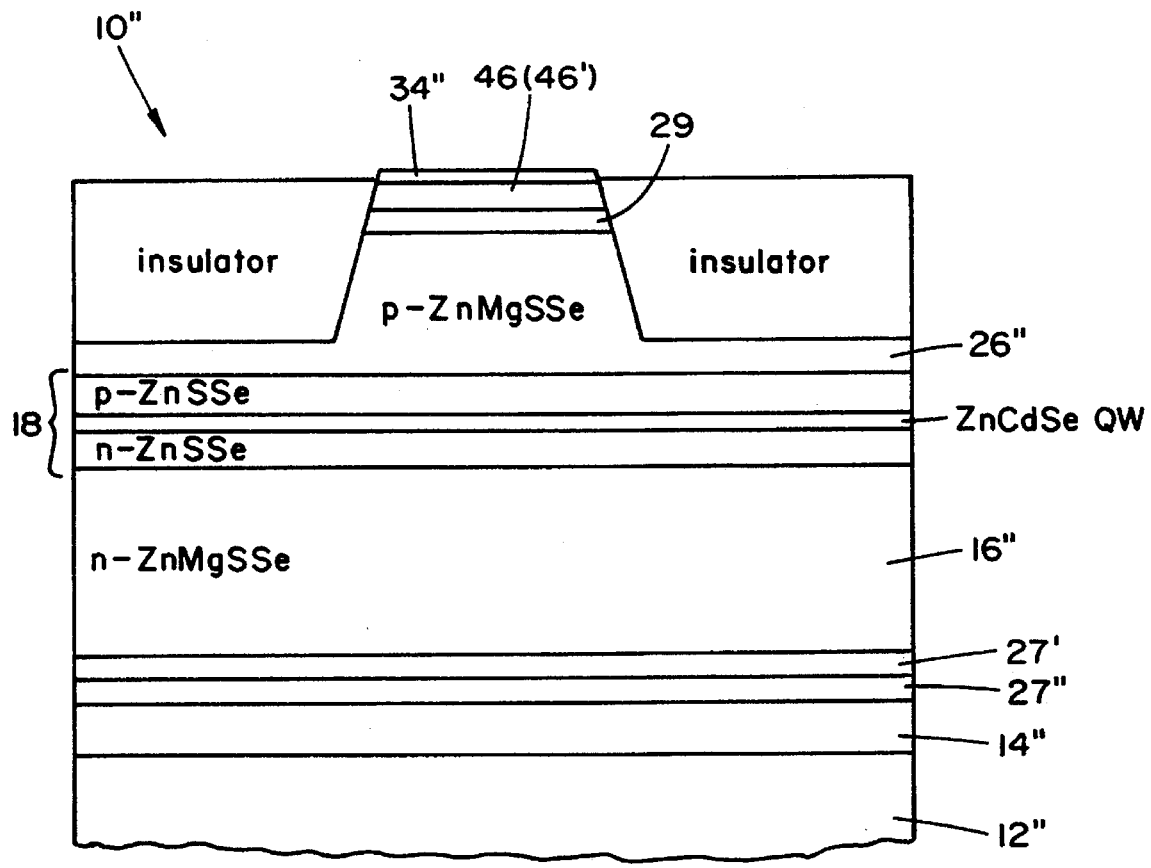
FIG. 21 is a schematic drawing showing the cross-section of a II–VI laser emitting device 10″ having either embodiment of the graded contact 46,46′ formed therein.

FIG. 21 illustrates the ohmic contact 46 (46') incorporated in the quaternary group II–VI (ZnMgSSe) laser emitting device 10" having one quantum well region 18", as described below, located on a first group II–VI cladding layer 16". This device is formed on an n-type group III–V GaAs substrate 12" having an optional GaAs buffer layer 14". Additionally, layer 27 comprising ZnSSe and, layer 27" of ZnSe, act as transitional layers between the substrate 12" and/or buffer layer 14" and the first cladding layer 16". The Zn(Se,Te) continuously graded contact structure 46 (46') is shown residing on top of a quaternary group II–VI compound cladding layer 26, ZnMgSSe, with a palladium and gold contact 34" formed thereon. A transitional layer 29, comprising ZnSSe may be formed on top of the second cladding layer 26" to reduce any barrier to hole injection.

Figure 10A:
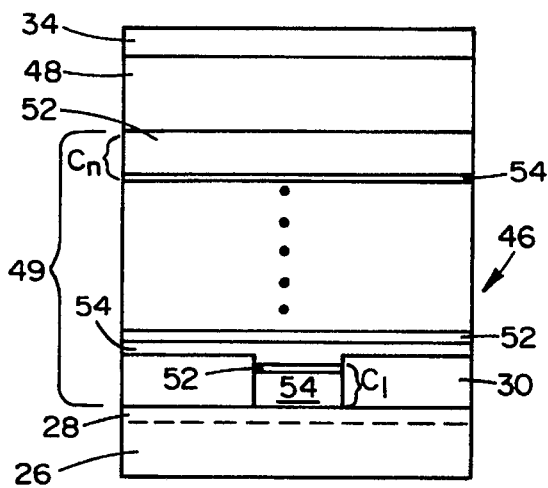
FIG. 10(a) is a schematic drawing showing the cross-section of the pseudo-graded bandgap ohmic contact 46 of the present invention incorporated on top into the second cladding layer of the compound semiconductor light emitting device 10 of FIG. 1.
Figure 10B:
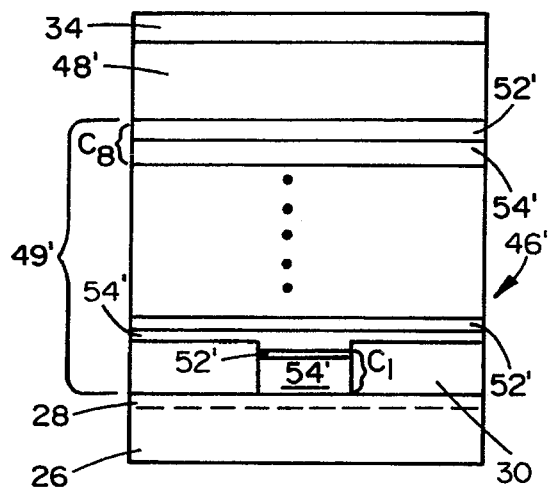
FIG. 10(b) is a schematic drawing showing the cross-section of the pseudo-graded bandgap ohmic contact 46' of the present invention formed on top of the second cladding layer 26 of the compound semiconductor light emitting device 10 of FIG. 1.

With regard to incorporating the contact 46 or 46' having a truncated pseudo graded (multiple cell) bandgap region in the present LEDs and diode lasers, FIG. 10(a) and FIG. 10(b) respectively, show the ohmic contact 46 (46') of the present invention as it would be oriented when used to contact the heavily doped portion 28 of the devices of FIGS. 1 and 2. To incorporate the contact 46 (46') into the device 10 or 42, the second ZnSe layer 50 (50') would correspond to the cladding layer (or a buffer or transition layer). Alternatively, it may be grown directly on top of an uppermost cladding layer (or a buffer or transition layer). The electrode 34 would then be replaced by the graded contact 46 (46'). Lastly, a contact electrode 34 is applied to the first layer 48 (48'). The contact electrode 34 can be gold, indium, palladium, platinum or ITO and is preferably palladium and gold alloy that may include titanium.

Although the contact 46 and modified contact 46' having a truncated graded bandgap region of the present invention can be employed in the LEDs and diode lasers of the present invention described above when the top contact layer 28 has a p-type conductivity, it should be understood that they (whether the continuously graded layer or pseudo graded multiple cell layer) can be used in any device (including devices that have a top contact layer of n-type conductivity, are not light emitting, or, do not have quantum wells) where there is a need to form a metal contact to a p-type II–VI compound semiconductor material.

Figure 22:
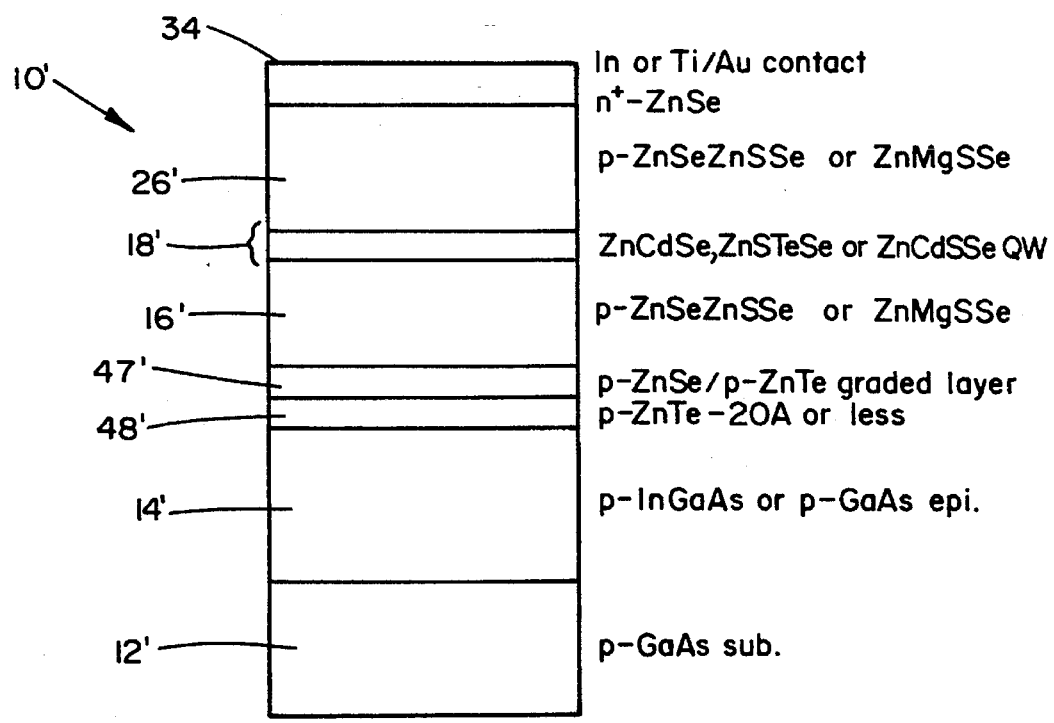
FIG. 22 is a schematic drawing showing the cross-section of a II–VI "n on top" compound semiconductor light emitting device 10′ formed on a p-type substrate and having a graded bandgap layer formed therein.

FIG. 22 illustrates a light emitting device 10' that is fabricated on a p-type GaAs substrate layer 12'. In such a device, there exists a large valence band offset between the first p-type II–VI compound, for e.g., ZnSe constituting cladding layer 16', and the substrate p-GaAs layer 12' or p-InGaAs buffer layer or epilayer 14'. Consequently, there exists a resulting barrier to hole injection from the substrate layer into the first group II–VI compound layer. The energy barrier to hole injection at the p-GaAs/p-ZnSe interface could be reduced with the inclusion of the continuously graded or pseudo graded ohmic contacts 46, 46' sandwiched between a relatively thin layer 48' of p-ZnTe having a thickness of 20Å or less, and the ZnSe cladding layer 16'. This is because the valence band offset between ZnTe and GaAs is very small (on the order of 200 meV) as compared with the large valence band offset between ZnSe and GaAs. With the removal of the valence band potential barrier between cladding layer 16' p-ZnSe and p-GaAs substrate layer 12' or buffer layer 14', a group II–VI light emitter, where low resistivity contacts to n-type ZnSe is easily established, is readily feasible. A device having an n-type top contact scheme and an inserted graded bandgap contact between the substrate (or buffer layer) and first group II–VI layer, is extremely appealing when functioning as a LED or laser device. This is because a significant amount of lateral current spreading, a phenomenon characteristic of high mobility, low resistivity conducting layers such as n-type ZnSe and ZnSSe, is highly desirable for maximizing the light emission in the region of the opaque electrodes.

It is understood that other group III–V compound semiconductor compounds may be used as the substrate 12' or the buffer layer 14' depending upon either the desired type of light emission, i.e., type of wideband group II–VI material, or, to provide lattice matching. For instance, other compounds of GaAs and InGaAs that include elements such as phosphorous and aluminum, in various combinations, may be used. The exact proportions of such elements in the group III–V compounds are adjusted to provide lattice matching with the group II–VI devices. For example, it is desirable to decrease the lattice constant of the substrate and/or buffer to accommodate wider bandgap II–VI light emitting materials.

Each embodiment of the graded bandgap contacts of the present invention reduces heat at the contact, lowers operating voltages, improves room temperature operation and extends the life of the present light emitting devices. For example, when the contacts 46 or 46' of the present invention is used to contact a p-type contact layer 28 of the II–IV heterostructure LED and diode lasers of the present invention, very low voltages (between 2.5–3.0 v) are required for the turn on of forward biased current flow. The turn on voltage for forward conductivity results in a current which is usefully expended in supplying electron-hole pairs into the QWs for efficient light emission. In addition, heating at the contact is greatly reduced thereby extending the life and improving room temperature operation of the present LEDs and lasers.

Figure 11:
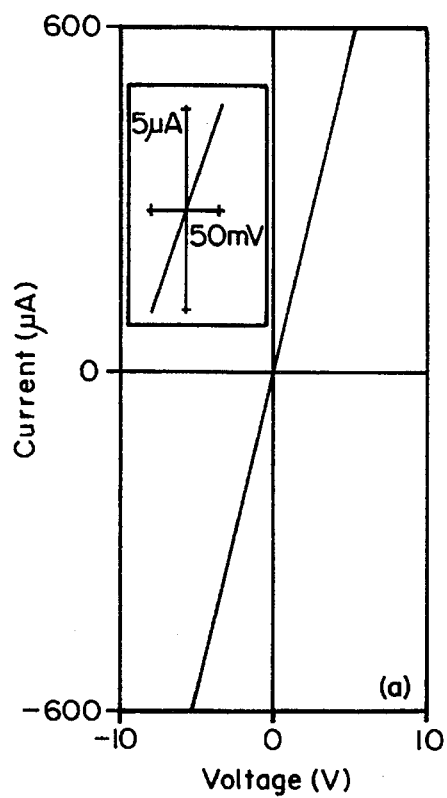
FIG. 11 is a diagram of the I–V characteristics of the graded bandgap ohmic contact of the present invention utilizing p-ZnTe and p-ZnSe as the first and second II–VI semiconductor materials respectively.
Figure 12:
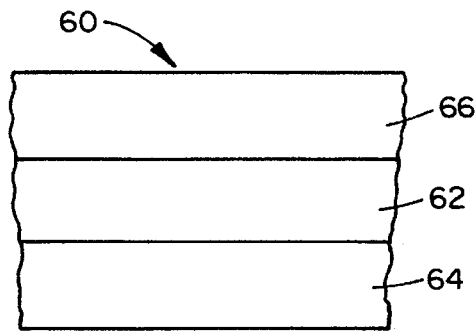
FIGS. 12–15 are schematic drawings showing the cross-section of the quantum well regions of the multicolor light emitting element of the present invention.

FIG. 11 shows the I–V characteristics measured between pairs of coplanar contact pads of the contact 46 and 46' of the present invention when ZnTe and ZnSe are used as the first and second II–VI semiconductors respectively. The contact pads analyzed were 4 mm square samples having 0.8 mm diameter contact pads in each of the four corners. The p-ZnSe layer 50 was a 2 μm thick nitrogen doped epilayer grown on an undoped semi-insulating GaAs substrate and had a hole concentration of $3.2 \times 10^{17}$ cm$^{-3}$. The nitrogen doped p-ZnTe layer 48 had a hole concentration of $5 \times 10^{18}$ cm$^{-3}$. As shown in FIG. 12 by the straight line through the origin, the graded bandgap contact 46 of the present invention is perfectly ohmic. There is thus no barrier to the injection of holes into the p-ZnSe layer 50 demonstrating the presence of an ohmic contact. The inset in FIG. 12 shows that the I–V characteristics maintain the same slope even at a few mV from the origin. The specific contact resistance of the contact 42 of the present invention was measured to be in the range of $2-8 \times 10^{-3} \Omega \text{cm}^2$ which is acceptable for contact areas associated with the LEDs and diode lasers of the present invention. The contact resistance can be lowered as the growth is modified to more closely approach a continuous alloy grading and as doping levels are increased.

The pseudo graded contact 49 can be fabricated by MBE with the ZnSe or Zn(S,Se) layer 50 being formed by nitrogen doping as described above. The p-ZnTe layer 48 can be formed by MBE using nitrogen doping. For example, p-ZnTe can be grown by MBE at a temperature between about 275°–300° C. Elemental sources can be used for Zn and Te and a typical Zn/Te flux ratio is approximately 1.2. Nitrogen from an rf plasma source can be used as the p-type dopant. The growth rates for this process are between about 0.36 and 0.52 μm/hr.

Suitable materials for the first p-type II–VI semiconductor material include ZnTe, ZnSTe, ZnMgTe, ZnMnTe, ZnBaTe, ZnBeTe, ZnCaTe, ZnSrTe, ZnMgSTe, ZnMnSTe, ZnCdTe and ZnCdSTe. Suitable materials for the second p-type II–VI semiconductor material include ZnSe, ZnSSe, ZnMgSe, ZnMnSe, ZnBaSe, ZnBeTe, ZnCaTe, ZnSrTe, ZnMgSSe, ZnMnSSe, ZnCdSe and ZnCdSSe. As described above, the graded region which facilitates the ohmic contact between these layers is formed either by continuous grading of the bandgap or the use of the multi-cell pseudo-graded bandgap contact.

Another embodiment of the present invention is directed to a multicolor monolithic light emitting element which includes a quantum well region as described above with regard to the embodiment of FIG. 1 with the modifications described below. Turning now to FIGS. 12–15, there is shown four II–VI quantum well regions capable of emitting light in four different colors. It should be understood that although each of the above four devices will be described with regard to only the QW region, each of the above four II–VI heterostructures can be fabricated on a III–V semiconductor substrate 12 with or without an epilayer 14 of the III–V semiconductor grown thereon as shown in FIG. 1. In addition, the first and second cladding layers 16, 26 as well as the heavily doped portion 28 are also used. The conductivity types for layers 12, 14, 16 and 26 as well as the material composition thereof are identical to that described above. In addition, the contact layer be ITO or a graded bandgap contact as described above. The operation of each of the four devices is identical to that described above with regard to FIGS. 1 and 2—i.e., injected electron hole pairs are the excitation mechanism.

Figure 14:
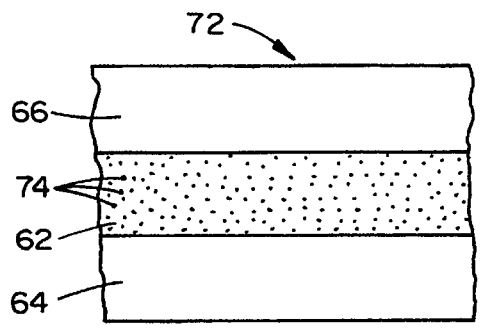
Figure 13:
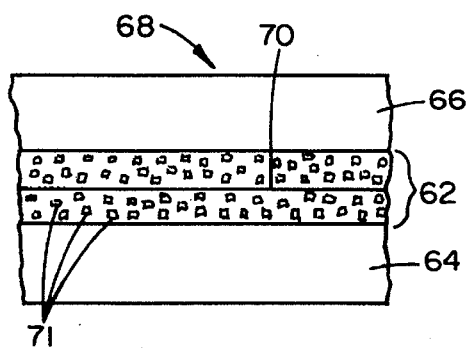
Figure 15:
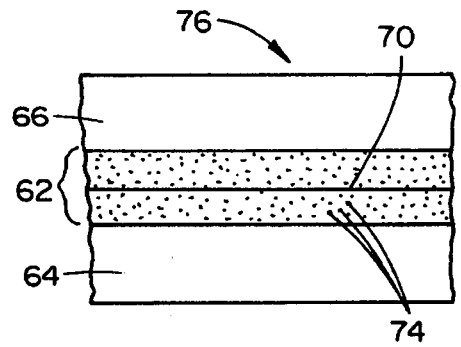

Turning to FIG. 12, the II–VI heterostructure 60 includes a quantum well layer 62 sandwiched between barrier layers 64, 66. As an illustrative example, the quantum well layer 62 can be (Zn,Cd)Se and the barrier layers 64 and 66 can be Zn(S,Se). This is the same II–VI heterostructure shown in FIG. 1, and as described above can be used to obtain blue light emission. In FIG. 13, the II–VI heterostructure 68 includes all the elements of the heterostructure 60 with the addition of an atomic monolayer 70 of ZnTe disposed within the (Zn,Cd)Se quantum well 62. Alternatively, Te 71 can be distributed throughout the well. The ZnTe monolayer 70 or Te distribution in the well 71 causes the wavelength of emission to shift to green. As shown in FIG. 14, the heterostructure 72 includes all the elements of the heterostructure 60 with the addition of Mn 74 into the (Zn,Cd)Se quantum well 62. This will cause the emission to shift to the yellow due to the efficient conversion of the electron hole pair excitation into the d-electron excitation of the Mn ion. In the fourth II–VI heterostructure 76 shown in FIG. 15, all the elements of the heterostructure 60 are present with the addition of an atomic monolayer of ZnTe 70 (or Te 71 distributed throughout the well) and Mn 74 dispersed throughout the (Zn,Cd)Se quantum well 62. This will shift the emission into the red due to the change in the local atomic environment of the Mn ion d-electron in the SeTe anion local field.

Figure 16:
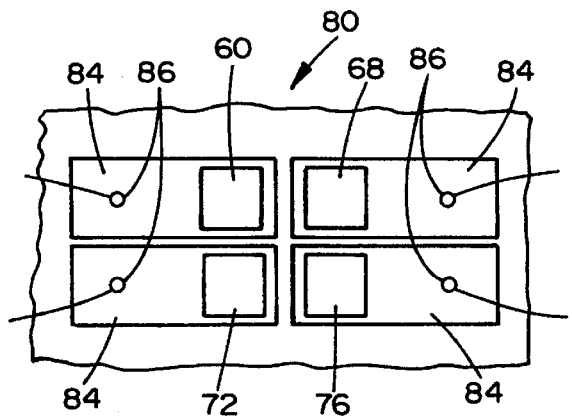
FIG. 16 is a top view of the monolithic multicolor light emitting element of the present invention.
Figure 17:
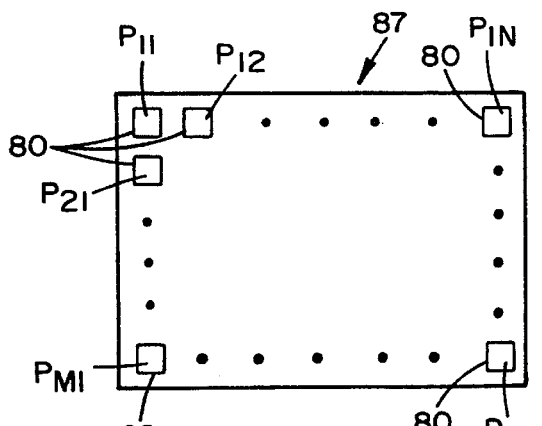
FIG. 17 is a schematic drawing of a flat screen display comprising an M×N array of monolithic multicolor light emitting elements of the present invention.

Turning now to FIG. 16, the four II–VI heterostructures 60, 68, 72, and 76 can be fabricated adjacent to each other in a monolithic fashion as a multicolor light emitting element 80 (e.g., a pixel element). Although the monolithic multicolor light emitting element 80 is shown as having four semiconductor light emitting elements, the element 80 can be fabricated as having any two or any three of the four light emitting devices. Each of the devices 60, 68, 72 and 76 are grown on a common III–V semiconductor substrate 82 which can be for example p-GaAs. As a result, the lateral current spreading feature will also be present. This can be taken advantage to define display configurations for any desired images by depositing an insulator layer and using conventional photolithographic and etching techniques to define emission regions. In addition, this allows transparent electrodes 84 to be deposited which can be contacted locally by small indium contacts 86. As shown in FIG. 17, an M×N array of pixel elements 80 (having 2, 3 or 4 light emitting devices) can be fabricated as a flat screen display 87 such as a television screen.

Figure 18:
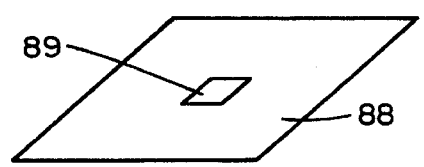
FIG. 18 is a perspective view of a mask element for use in fabricating the monolithic multicolor light emitting element of the present invention.
Figure 19:
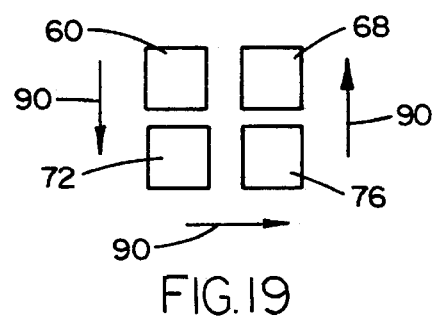
FIG. 19 is a schematic drawing of a pattern of mask motion which can be used in fabricating the monolithic multicolor light emitting element of the present invention.

In order to facilitate the fabrication of the monolithic multicolor element 80, MBE growth combined with selective area masking can be used as shown in FIGS. 18 and 19. As shown by the arrows 90 in FIG. 19, by a three step x-y motion of the mask 88, the four color emitting devices can be prepared adjacent to each other in a monolithic fashion to form a pixel element. The arrows 90 show the x-y pattern of mask motion during which the growth of individual pixel elements takes place to define a 2×2 fullcolor pixel element. The mask 88 has a single aperture 89 with a diameter of between approximately 1 and 5 μm. At each mask position, each of the above four devices 60, 68, 72 and 76 can be fabricated by the MBE methods described above with regard to the II–VI light emitting device of FIGS. 1 and 2. The atomic monolayer of ZnTe is grown by well known atomic layer epitaxy (ALE) techniques. For example, for the device 68, the MBE growth of the (Zn,Cd)Se quantum well is interrupted for the ALE growth of the ZnTe monolayer. The remainder of the quantum well, the cladding layer and contact layer are then grown by MBE. The Mn or Te can be dispersed throughout the quantum well region by utilizing a small Mn or Te flux while the well layer is being grown by MBE.

Applications for the blue LEDs and lasers and the monolithic multicolor light emitting element of the present invention include laser printing, motion monitoring, scanners, optical disks (CD pickups), bar code readers, fax machines, copiers, pointers, signs and displays, medical equipment, chemical analyzers, automotive/aircraft indicators, underwater imaging/communications, TV, HDTV, monitors and flat displays.

While the invention has been particularly shown and described with respect to preferred embodiments thereof, it should be understood by those skilled in the art that the foregoing and other changes in form and detail may be made therein without departing from the spirit and scope of the invention which should be limited only by the scope of the appended claims.

What is claimed is:

1. A semiconductor light emitting device comprising:
   at least one quantum well region disposed between first and second cladding layers, said first and second cladding layers having a first and second conductivity type respectively, each of said cladding layers being of a first II–VI compound semiconductor material wherein said first conductivity type is n-type and second conductivity type is p-type;
   said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II, C is an element from Group VI, and $0<x<1$;
   a contact layer of a p-type fourth II–VI compound semiconductor material; and
   a graded bandgap p-type II–VI region sandwiched between the second cladding layer and the contact layer.

2. The semiconductor light emitting device of claim 1, wherein the third II–VI compound semiconductor material has the formula $A_xB_{(1-x)}D_yE_{(1-y)}$ where D and E are two different elements from Group VI, where $0<y<1$.

3. The semiconductor light emitting device of claim 1, further including a substrate of a III–V compound semiconductor material having the first conductivity type.

4. The semiconductor light emitting device of claim 3, further including a buffer layer of the III–V compound semiconductor material formed on said substrate and having the first conductivity type, said first cladding layer being formed on said buffer layer.

5. The semiconductor light emitting device of claim 4, wherein said first cladding layer is lattice matched to said buffer layer.

6. The semiconductor light emitting device of claim 1, wherein said third II–VI compound semiconductor material is $Zn_xCd_{1-x}Se$ ($0.80 \leq x \leq 0.88$).

7. The semiconductor light emitting device of claim 6, wherein said second II–VI compound semiconductor material is $ZnS_xSe_{1-x}$ ($0.07 \leq x \leq 0.08$).

8. The semiconductor light emitting device of claim 7, wherein said first II–VI compound semiconductor material is $ZnS_xSe_{1-x}$ ($0.07 \leq x \leq 0.08$).

9. The semiconductor light emitting device of claim 8, wherein an upper portion of said second cladding layer is heavily doped with the second conductivity type.

10. The semiconductor light emitting device of claim 9, wherein said III–V compound semiconductor material is GaAs, said first conductivity type is p-type and said second conductivity type is n type.

11. The semiconductor light emitting device of claim 10, wherein six of said quantum well regions are disposed being said first and second cladding layers.

12. The semiconductor light emitting device of claim 1, wherein said first and second II–VI compound semiconductor materials is selected from the group consisting of ZnSe, ZnSSe, ZnMnSe, ZnMnSSe, ZnSTe, ZnTe, ZnMnTe and ZnMnSTe.

13. The semiconductor light emitting device of claim 12, wherein said third II–VI compound semiconductor material is selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe.

14. The semiconductor light emitting device of claim 5, further including means for applying a voltage to said device such that said device is a light emitting diode.

15. The light emitting device of claim 14 wherein said first conductivity type is p-type and said second conductivity is n-type such that during application of said voltage lateral current spreading is produced at an interface of the buffer layer and the first cladding layer.

16. The semiconductor light emitting device of claim 1, further including a pair of cleaved facets and means for applying a pulsed or continuous wave current to said device such that said device is a diode laser.

17. The semiconductor light emitting device of claim 1, further including an insulating layer formed on said second cladding layer, said insulating layer having an opening.

18. The semiconductor light emitting device of claim 17, further including a contact layer formed on said insulating layer and contacting said heavily doped portion of said second cladding layer through said opening.

19. The semiconductor light emitting device of claim 18, wherein said contact layer is a material selected from the group consisting of indium-tin oxide, indium and gold.

20. The semiconductor light emitting device of claim 1, wherein said first and fourth II–VI compound semiconductor materials are ZnSe and ZnTe respectively and said graded bandgap region is p-Zn(Te,Se).

21. The semiconductor light emitting device of claim 1, wherein said graded bandgap p-type II–VI region comprises a plurality of cells with each of said cells having first and second thin layers of the p-type first and fourth II–VI compound semiconductor materials respectively, said first thin layer of a first cell being in contact with the second cladding layer and said second thin layer of a last cell being in contact with the contact layer.

22. The semiconductor light emitting device of claim 21, wherein the first and fourth II–VI compound semiconductor materials are Zn(S,Se) and ZnTe respectively.

23. The semiconductor light emitting device of claim 6, further including manganese disposed throughout said (Zn,Cd)Se quantum well.

24. The semiconductor light emitting device of claim 6, further including tellurium disposed throughout said (Zn,Cd)Se quantum well.

25. The semiconductor light emitting device of claim 6, further including an atomic monolayer of ZnTe disposed within said (Zn,Cd)Se quantum well.

26. The semiconductor light emitting device of claim 25, further including manganese disposed throughout said (Zn,Cd)Se quantum well.

27. A semiconductor light emitting device comprising:
   at least one quantum well region disposed between first and second cladding layers, said first and second cladding layers having a first and second conductivity type respectively, each of said cladding layers being of a first II–VI compound semiconductor material;
   said at least one quantum well region comprising a (Zn,Cd)Se quantum well layer sandwiched between first and second Zn(S,Se) barrier layers;
   a contact layer of a second I–VI compound semiconductor material of said second conductivity type; and
   a graded bandgap second conductivity type II–VI region sandwiched between the second cladding layer and the contact layer.

28. The semiconductor light emitting device of claim 27, further including a substrate of a III–V compound semiconductor material having a first conductivity type.

29. The semiconductor light emitting device of claim 28, further including a buffer layer of the III–V compound semiconductor material formed on the substrate, said first cladding layer being disposed on the buffer layer.

30. A monolithic multicolor light emitting element comprising:
   first and second semiconductor light emitting devices for emitting light of two different colors respectively formed on a substrate in a spaced relationship, each of said semiconductor light emitting devices including:
   at least one quantum well region disposed between first and second cladding layers, said first and second cladding layers having a first and second conductivity type respectively, each of said cladding layers being of a first II–VI compound semiconductor material;
   said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II and C is at least one element from Group VI;
   a contact layer of a second conductivity type fourth II–VI compound semiconductor material; and
   a graded bandgap second conductivity type II–VI region sandwiched between the second cladding layer and the contact layer.

31. The monolithic multicolor light emitting element of claim 30, further including a third semiconductor light emitting device for emitting light of a third color formed on said substrate.

32. The monolithic multicolor light emitting element of claim 31, further including a fourth semiconductor light emitting device for emitting light of a fourth color formed on said substrate.

33. The monolithic multicolor light emitting element of claim 32 wherein said third and fourth semiconductor light emitting devices comprises:
   at least one quantum well region disposed between first and second cladding layers, said first and second cladding layers having a first and second conductivity type respectively, each of said cladding layers being of a first II–VI compound semiconductor material; and
   said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II and C is at least one element from Group VI.

34. The monolithic multicolor light emitting element of claim 33 wherein said substrate comprises a III–V compound semiconductor material having a first conductivity type and a buffer layer of the III–V compound semiconductor material formed thereon.

35. The monolithic multicolor light emitting element of claim 33 wherein said second II–VI compound semiconductor material Zn(S,Se) and said third II–VI compound semiconductor material is (Zn,Cd)Se.

36. The monolithic multicolor light emitting element of claim 35, wherein said second light emitting device further includes manganese disposed throughout said (Zn,Cd)Se quantum well.

37. The monolithic multicolor light emitting element of claim 36, wherein said third light emitting device further includes tellurium disposed throughout said (Zn,Cd)Se quantum well.

38. The monolithic multicolor light emitting element of claim 36, wherein said third light emitting device further includes an atomic monolayer of ZnTe disposed within said (Zn,Cd)Se quantum well.

39. The monolithic multicolor light emitting element of claim 38, wherein said fourth light emitting device further includes manganese disposed throughout said (Zn,Cd)Se well layer and an atomic monolayer of ZnTe disposed within said (Zn,Cd)Se well layer.

40. A flat screen display comprising an M×N array of pixel elements, each of said pixel elements comprising:
   first and second semiconductor light emitting devices for emitting light of two different colors respectively formed on a substrate in a spaced relationship, each of said semiconductor light emitting devices including:
   at least one quantum well region disposed between first and second cladding layers, said first and second cladding layers having a first and second conductivity type respectively, each of said cladding layers being of a first II–VI compound semiconductor material;

said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II and C is at least one element from Group VI;

a contact layer of a second conductivity type fourth II–VI compound semiconductor material; and a graded bandgap second conductivity type II–VI region sandwiched between the second cladding layer and the contact layer.

41. The flat screen display of claim 30, wherein each of said pixel elements further includes a third semiconductor light emitting device for emitting light of a third color formed on said substrate.

42. The flat screen display of claim 41, wherein each of said pixel elements further includes a fourth semiconductor light emitting device for emitting light of a fourth color formed on said substrate.

43. The flat screen display of claim 32, wherein said third and fourth semiconductor light emitting devices comprises:

at least one quantum well region disposed between first and second cladding layers, said first and second cladding layers having a first and second conductivity type respectively, each of said cladding layers being of a first II–VI compound semiconductor material; and said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II and C is at least one element from Group VI.

44. A semiconductor light emitting device comprising:

at least one quantum well region disposed between first and second cladding layers, said first and second cladding layers having a first and second conductivity type respectively, each of said cladding layers being of a first II–VI compound semiconductor material;

said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II and C is at least one element from Group VI and $0 \leq x \leq 1$;

an insulating layer formed on said second cladding layer, said insulating layer having an opening therein to expose a portion of said second cladding layer; and a graded bandgap p-type II–VI region sandwiched between said exposed portion of said second cladding layer and a contacting layer comprising a fourth p-type II–VI compound semiconductor material.

45. The semiconductor light emitting device of claim 44 further comprising a metal contact formed on top of said contacting layer.

46. The semiconductor light emitting device of claim 44, wherein the third II–VI compound semiconductor material has the formula $A_xB_{(1-x)}D_yE_{(1-y)}$ where D and E are two different elements from Group VI and $0<y<1$.

47. The semiconductor light emitting device of claim 44, further including a substrate of a III–V compound semiconductor material having the first conductivity type.

48. The semiconductor light emitting device of claim 47, further including a buffer layer of the III–V compound semiconductor material formed on said substrate and having the first conductivity type, said first cladding layer being formed on said buffer layer.

49. The semiconductor light emitting device of claim 48, wherein said first cladding layer is lattice matched to said buffer layer.

50. The semiconductor light emitting device of claim 44, wherein said third II–VI compound semiconductor material is $Zn_xCd_{1-x}Se$ ($0.80 \leq x \leq 0.88$).

51. The semiconductor light emitting device of claim 50, wherein said second II–VI compound semiconductor material is $ZnS_xSe_{1-x}$ ($0.07 \leq x \leq 0.08$).

52. The semiconductor light emitting device of claim 51, wherein said first II–VI compound semiconductor material is $ZnS_xSe_{1-x}$ ($0.07 \leq x \leq 0.08$).

53. The semiconductor light emitting device of claim 52, wherein an upper portion of said second cladding layer is heavily doped with the second conductivity type.

54. The semiconductor light emitting device of claim 53, wherein said III–V compound semiconductor material is GaAs, said first conductivity type is p-type and said second conductivity type is n type.

55. The semiconductor light emitting device of claim 54, wherein six of said quantum well regions are disposed being said first and second cladding layers.

56. The semiconductor light emitting device of claim 44, wherein said first and second II–VI compound semiconductor materials is selected from the group consisting of ZnSe, ZnSSe, ZnMnSe, ZnMnSSe, ZnSTe, ZnTe, ZnMnTe and ZnMnSTe.

57. The semiconductor light emitting device of claim 56, wherein said third II–VI compound semiconductor material is selected from the group consisting of ZnCdSe, ZnMgSe, ZnBaSe, ZnBeSe, ZnCaSe, ZnSrSe, ZnCdSSe, ZnMgSSe, ZnCdTe, ZnMgTe, ZnBaTe, ZnBeTe, ZnCaTe, ZnSrTe, ZnCdSTe and ZnMgSTe.

58. The semiconductor light emitting device of claim 49, further including means for applying a voltage to said device such that said device is a light emitting diode.

59. A semiconductor light emitting device comprising:

at least one quantum well region disposed between first and second cladding layers, said first and second cladding layers having a first and second conductivity type respectively, each of said cladding layers being of a first II–VI compound semiconductor material;

said at least one quantum well region comprising a quantum well layer sandwiched between first and second barrier layers, said first and second barrier layers being of a second II–VI compound semiconductor material, said first cladding layer being lattice matched to said first barrier layer and said second cladding layer being lattice matched to said second barrier layer, said quantum well layer being of a third II–VI compound semiconductor material having the formula $A_xB_{(1-x)}C$ wherein A and B are two different elements from Group II and C is at least one element from Group VI and $0 \leq x \leq 1$; and a graded bandgap p-type II–VI region sandwiched between said substrate and said first cladding layer.

60. The semiconductor light emitting device of claim 59 further comprising a metal contact formed on top of said second cladding layer.

61. The semiconductor light emitting device of claim 59, wherein the third II–VI compound semiconductor material has the formula $A_xB_{(1-x)}D_yE_{(1-y)}$ where D and E are two different elements from Group VI and $0<y<1$.

62. The semiconductor light emitting device of claim 59, further including a substrate of a III–V compound semiconductor material having the first conductivity type.

63. The semiconductor light emitting device of claim 61, further including a buffer layer of the III–V compound semiconductor material formed on said substrate and having the first conductivity type, said first cladding layer being formed on said buffer layer.

64. The semiconductor light emitting device of claim 61 wherein said first conductivity type is p-type and said second conductivity is n-type, said graded bandgap p-type II–VI region sandwiched between said III–V buffer layer and said first III–V cladding layer.

65. The semiconductor light emitting device of claim 1, wherein said graded bandgap p-type II–VI region comprises a fifth II–VI compound semiconductor material having a first group VI element from said first II–VI semiconductor material and a second group VI element from said second II–VI semiconductor material, said first group VI element being different from said second group VI element.

* * * * *

UNITED STATES PATENT AND TRADEMARK OFFICE
CERTIFICATE OF CORRECTION

PATENT NO. : 5,610,413
DATED : March 11, 1997
INVENTOR(S) : Yongping Fan, et al.

It is certified that error appears in the above-indentified patent and that said Letters Patent is hereby corrected as shown below:

Column 11, line 40: "area the" should read --area (the--

Column 12, line 11: "(=4 " should read --($\approx$ 4 --

Column 13, line 47: "cm" should read --$\Omega$ cm --

Column 17, line 12: "52" " should read --52' --

Column 22, line 11, Claim 6: "Zn xCd" should read -- $Zn_xCd$ --

Column 23, line 63, Claim 30: " $A_xB(_{1-x})C$ " should read -- $A_xB_{(1-x)}C$ --

Signed and Sealed this

Seventeenth Day of February, 1998

*Attest:*

BRUCE LEHMAN

*Attesting Officer*  *Commissioner of Patents and Trademarks*